United States Patent
Maeda et al.

(10) Patent No.: US 10,604,681 B2
(45) Date of Patent: Mar. 31, 2020

(54) SOLVENT-FREE LIGHT-CURABLE ADHESIVE COMPOSITION

(71) Applicant: NISSAN CHEMICAL INDUSTRIES, LTD., Tokyo (JP)

(72) Inventors: Daisuke Maeda, Funabashi (JP); Naoya Nishimura, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/579,062

(22) PCT Filed: Jun. 1, 2016

(86) PCT No.: PCT/JP2016/066098
§ 371 (c)(1),
(2) Date: Dec. 1, 2017

(87) PCT Pub. No.: WO2016/194920
PCT Pub. Date: Dec. 8, 2016

(65) Prior Publication Data
US 2018/0163097 A1    Jun. 14, 2018

(30) Foreign Application Priority Data

Jun. 2, 2015 (JP) ................................. 2015-112205
Nov. 4, 2015 (JP) ................................. 2015-216660

(51) Int. Cl.

| | |
|---|---|
| C09J 11/08 | (2006.01) |
| C09J 4/00 | (2006.01) |
| C09J 11/06 | (2006.01) |
| C09J 179/04 | (2006.01) |
| G02B 1/04 | (2006.01) |
| C08F 226/02 | (2006.01) |
| C09J 7/10 | (2018.01) |
| C09J 133/04 | (2006.01) |
| C08G 73/02 | (2006.01) |
| C09J 133/14 | (2006.01) |
| C09J 7/30 | (2018.01) |
| C08G 69/00 | (2006.01) |
| C08G 73/06 | (2006.01) |
| C09J 133/08 | (2006.01) |
| C09J 133/10 | (2006.01) |
| G02B 1/111 | (2015.01) |
| H01L 31/0216 | (2014.01) |
| C08K 5/3492 | (2006.01) |
| C08F 220/14 | (2006.01) |
| C08F 220/18 | (2006.01) |
| C08F 220/10 | (2006.01) |

(52) U.S. Cl.
CPC ............ *C09J 11/08* (2013.01); *C08F 226/02* (2013.01); *C08G 69/00* (2013.01); *C08G 73/026* (2013.01); *C08G 73/0273* (2013.01); *C08G 73/0644* (2013.01); *C09J 4/00* (2013.01); *C09J 7/10* (2018.01); *C09J 7/30* (2018.01); *C09J 11/06* (2013.01); *C09J 133/04* (2013.01); *C09J 133/08* (2013.01); *C09J 133/10* (2013.01); *C09J 133/14* (2013.01); *C09J 179/04* (2013.01); *G02B 1/04* (2013.01); *G02B 1/111* (2013.01); *H01L 31/0216* (2013.01); *C08F 220/10* (2013.01); *C08F 220/14* (2013.01); *C08F 220/18* (2013.01); *C08K 5/3492* (2013.01); *C09J 2203/326* (2013.01); *C09J 2205/102* (2013.01); *C09J 2205/31* (2013.01); *C09J 2433/00* (2013.01)

(58) Field of Classification Search
None
See application file for complete search history.

(56) References Cited

U.S. PATENT DOCUMENTS

| | | | |
|---|---|---|---|
| 9,663,685 | B2 | 5/2017 | Wang et al. |
| 2014/0142210 | A1 | 5/2014 | Zhang et al. |
| 2015/0094420 | A1 | 4/2015 | Nishimura et al. |

FOREIGN PATENT DOCUMENTS

| | | |
|---|---|---|
| JP | 2014-523472 A | 9/2014 |
| JP | 2014-525960 A | 10/2014 |
| JP | 2015-91919 A | 5/2015 |
| WO | WO 2013/168787 A1 | 11/2013 |

OTHER PUBLICATIONS

International Search Report (PCT/ISA/210) issued in PCT/JP2016/066098, dated Jul. 12, 2016.
Written Opinion of the International Searching Authority (PCT/ISA/237) issued in PCT/JP2016/066098, dated Jul. 12, 2016.

*Primary Examiner* — Robert T Butcher
(74) *Attorney, Agent, or Firm* — Birch, Stewart, Kolasch & Birch, LLP

(57) ABSTRACT

A solvent-free light-curable adhesive composition includes: for example, a triazine ring-containing polymer including a repeating unit structure represented by formula [3] and having a weight-average molecular weight of 500-5000; and a reactive diluent such as N-vinylformamide, the composition not including a solvent. The solvent-free light-curable adhesive composition has good compatibility with acrylic materials and the like, which are adhesive components, even without including a solvent.

[3]

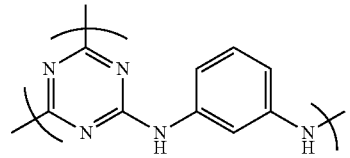

11 Claims, 1 Drawing Sheet

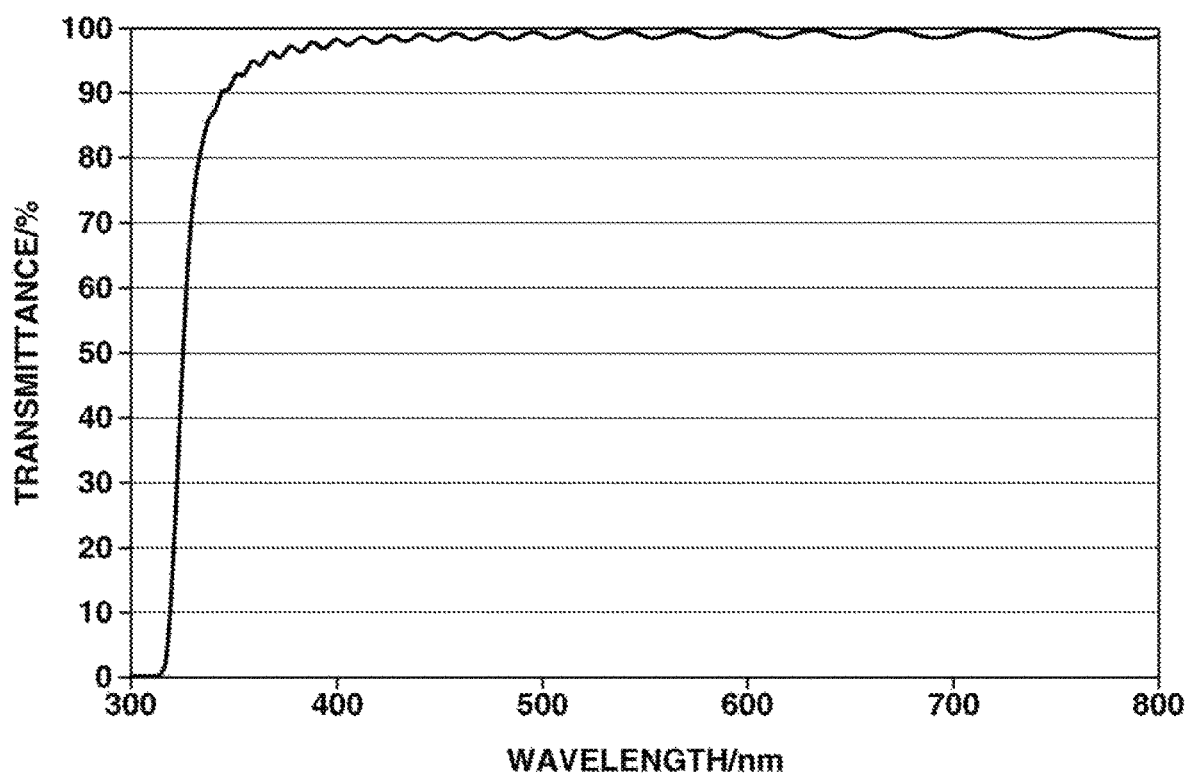

SOLVENT-FREE LIGHT-CURABLE ADHESIVE COMPOSITION

TECHNICAL FIELD

The present invention relates to a solvent-free light-curable adhesive additive composition, and more specifically to a solvent-free light-curable adhesive additive composition that contains a triazine ring-containing polymer and a reactive diluent but does not contain any solvent.

BACKGROUND ART

In recent years, electrostatic capacitance type touch panels are used as displays in various devices led by mobile equipment.

As principal ingredients of optical pressure-sensitive adhesives or optical adhesives employed upon assembling individual members that make up such devices, acrylic materials are generally used (see Patent Documents 1 and 2). These acrylic materials have high transparency, but differences arise between their refractive indices and those of the associated surfaces of the individual members, resulting in a problem that light is reflected at the interfaces and the light extraction efficiency is hence lowered.

In view of this problem, technologies have been reported to improve the visibility and light extraction efficiency of an optical member by controlling the refractive index of a multilayered film of the optical member though the use of a composition, which contains a triazine ring-containing polymer and a particular organic solvent, as a refractive index control material for an optical adhesive or a pressure-sensitive optical adhesive (see Patent Document 3).

Nonetheless, due to the inclusion of the organic solvent in the refractive index control material of Patent Document 3, a heating and drying step is needed, and moreover, an adhered member may be deteriorated at a surface thereof with the solvent upon its adhesion.

PRIOR ART DOCUMENTS

Patent Documents

Patent Document 1: JP-T 2014-523472
Patent Document 2: JP-T 2014-525960
Patent Document 3: JP-A 2015-091919
Patent Document 4: WO 2013/168787

SUMMARY OF THE INVENTION

Problems to be Solved by the Invention

In view of the foregoing problems, the present inventors made an attempt to divert a solvent-free, film-forming composition, which has already been reported by the present assignee and contains a high refractive index material, i.e., a triazine ring-containing polymer (see Patent Document 4), to a refractive index control material for an optical adhesive or the like. However, the solvent-free, film-forming composition has poor compatibility with the adhesive ingredient, i.e., the acrylic material, so that the adhesive compositions obtained all had high viscosity and were not suited for practical use.

With the foregoing circumstances in view, the present invention has as an object thereof the provision of a light-curable adhesive additive composition which has good compatibility with an adhesive ingredient, i.e., an acrylic material or the like although it does not contain any solvent.

Means for Solving the Problems

As a result of extensive investigations to achieve the above-described object, the present inventors discovered that the molecular weight of the triazine ring-containing polymer has bearing on its compatibility with the acrylic material, and found that the control of its molecular weight in a specific range makes it possible to obtain a composition having good compatibility with the acrylic material as an adhesive ingredient and also found that the composition is suited as a refractive index control material for a solvent-free light-curable adhesive. Those findings have then led to the completion of the present invention.

Accordingly, the invention provides:

1. A solvent-free light-curable adhesive additive composition including:

a triazine ring-containing polymer having a weight average molecular weight of 500 to 7,000 and a recurring unit structure of formula (1) below, and a reactive diluent of formula (A) below, in which the solvent-free light-curable adhesive additive composition is free of any solvent:

[Chemical Formula 1]

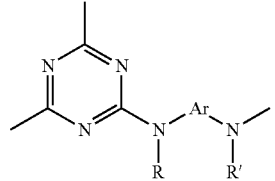

(1)

{In the formula, R and R' each independently represent a hydrogen atom, an alkyl group, an alkoxy group, an aryl group, or an aralkyl group, and Ar represents at least one moiety selected from the group consisting of moieties of formulas (2) to (13):

[Chemical Formula 2]

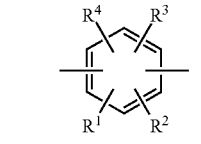

(2)

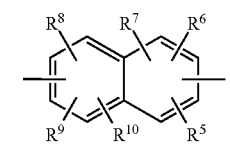

(3)

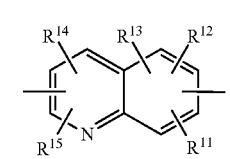

(4)

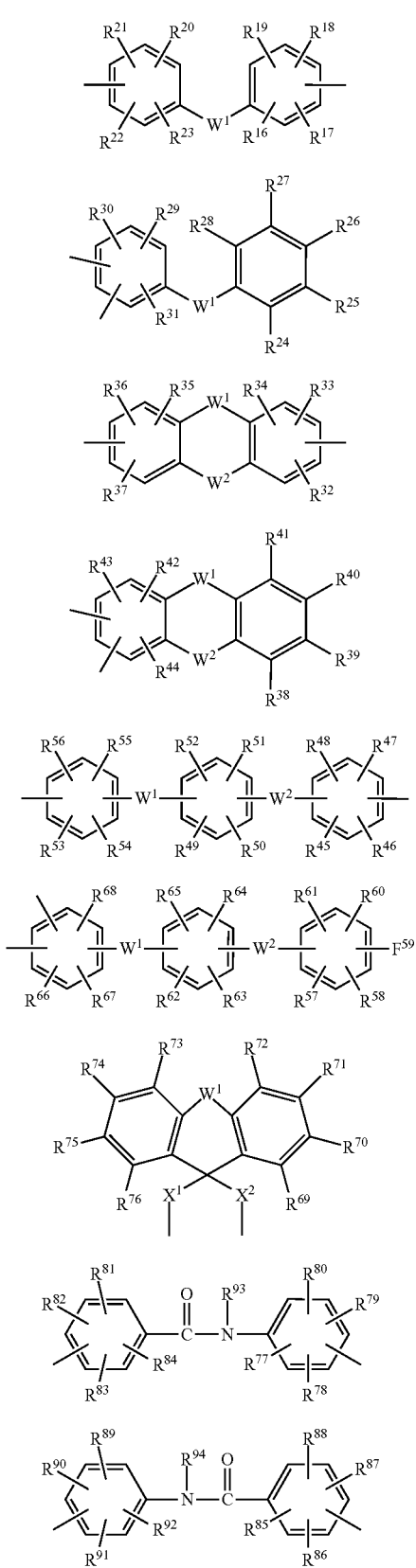

(5)
(6)
(7)
(8)
(9)
(10)
(11)
(12)
(13)

[In the formulas, $R^1$ to $R^{92}$ each independently represent a hydrogen atom, a halogen atom, a carboxyl group, a sulfo group, a linear or branched alkyl group having 1 to 10 carbons, or a linear or branched alkoxy group having 1 to 10 carbons, $R^{93}$ and $R^{94}$ each independently represent a hydrogen atom, or a linear or branched alkyl group having 1 to 10 carbons, $W^1$ and $W^2$ each independently represent a single bond, $CR^{95}R^{96}$ (in which $R^{95}$ and $R^{96}$ each independently represent a hydrogen atom or a linear or branched alkyl group having 1 to 10 carbons, with the proviso that $R^{95}$ and $R^{96}$ may be fused together to form a ring), C=O, O, S, SO, $SO_2$, or $NR^{97}$ (in which $R^{97}$ represents a hydrogen atom or a linear or branched alkyl group having 1 to 10 carbons), and $X^1$ and $X^2$ each independently represent a single bond, a linear or branched alkylene group having 1 to 10 carbons, or a group of formula (14):

[Chemical Formula 3]

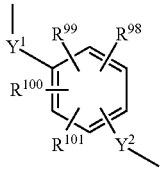

(14)

(In the formula, $R^{98}$ to $R^{101}$ each independently represent a hydrogen atom, a halogen atom, a carboxyl group, a sulfo group, an linear or branched alkyl group having 1 to 10 carbons, or a linear or branched alkoxy group having 1 to 10 carbons, and $Y^1$ and $Y^2$ each independently represent a single bond, or a linear or branched alkylene group having 1 to 10 carbons)]}:

[Chemical Formula 4]

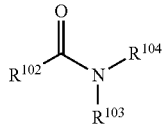

(A)

(In the formula, $R^{102}$ and $R^{104}$ each independently represent a hydrogen atom, an alkyl group having 1 to 10 carbons or a polymerizable carbon-carbon double bond-containing group, and $R^{103}$ represents a hydrogen atom or an alkyl group having 1 to 10 carbons, with the proviso that one of $R^{102}$ and $R^{104}$ is a polymerizable carbon-carbon double bond-containing group but $R^{102}$ and $R^{104}$ are not both a polymerizable carbon-carbon double bond-containing group at the same time;

2. The solvent-free light-curable adhesive additive composition of 1 above, in which $R^{102}$ and $R^{103}$ in the formula (A) are each a hydrogen atom and $R^{104}$ is a polymerizable carbon-carbon double bond-containing group;

3. The solvent-free light-curable adhesive additive composition of 1 or 2 above, in which the reactive diluent includes one or more reactive diluent selected from the group consisting of N-vinylformamide, 4-acryloylmorpholine, N-dimethylacrylamide, and N-diethylacrylamide;

4. The solvent-free light-curable adhesive additive composition of any one of 1 to 3 above, in which Ar is represented by the following formula (15);

[Chemical Formula 5]

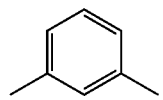

(15)

5. The solvent-free light-curable adhesive additive composition of any one of 1 to 4 above, which is for a solvent-free light-curable adhesive including an acrylic material as an adhesive ingredient;
6. A solvent-free light-curable adhesive including:
    the solvent-free light-curable adhesive additive composition of any one of 1 to 5 above; and
    at least one selected from the group consisting of allyl monomers, (meth)acrylic monomers and (meth)acrylic oligomers;
7. The solvent-free light-curable adhesive of 6 above, in which the (meth)acrylic monomers are one or more methyl (meth)acrylate, ethyl (meth)acrylate, butyl (meth)acrylate, 2-(2-ethoxyethoxy)ethyl acrylate, tetrahydrofurfuryl (meth)acrylate, lauryl acrylate, isooctyl acrylate, isodecyl acrylate, 2-phenoxyethyl acrylate, 2-ethylhexyl (meth)acrylate, isobornyl (meth)acrylate, adamantly (meth)acrylate, dicyclopentenyloxyethyl (meth)acrylate, dicyclopentadienyl (meth)acrylate, 2-hydroxyethyl (meth)acrylate, 2-hydroxypropyl (meth)acrylate, 2-hydroxybutyl (meth)acrylate, caprolactone acrylate, morpholine (meth)acrylate, hexanediol di(meth)acrylate, ethylene glycol dimethacrylate, trimethylolpropane triacrylate, pentaerythritol tetrahydrofuran acrylate, and urethane acrylate;
8. The solvent-free light-curable adhesive of 6 or 7 above, further including: a photoradical polymerization initiator,
9. An adhesive film obtained by curing the solvent-free light-curable adhesive of any one of 6 to 8 above;
10. An electronic device fabricated using the adhesive film of 9 above;
11. An optical device fabricated using the adhesive film of 9 above.

Advantageous Effects of the Invention

The adhesive additive composition of the present invention has good compatibility with an acrylic material as an adhesive ingredient although it does not contain any organic solvent, and therefore can be suitably used as a refractive index control material or the like for a solvent-free light-curable adhesive.

The addition of the adhesive additive composition of the present invention to an optical adhesive not only can form an adhesive layer of excellent transparency but also can provide the adhesive layer with a higher refractive index and can reduce its difference in refractive index from an adhered layer, and as a result, can provide improved visibility and light extraction efficiency.

The adhesive which contains the adhesive additive composition of the present invention is suited as an adhesive for devices for which transparency and a high refractive index are required, such as liquid-crystal displays, organic electroluminescence (EL) displays, touch panels, optical semiconductor (LED) devices, solid-state image sensors, organic thin-film solar cells, dye-sensitized solar cells, organic thin-film transistors (TFTs), and electronic devices and optical devices such as lenses, prisms, cameras, binoculars, microscopes and semiconductor exposure systems.

BRIEF DESCRIPTION OF THE DRAWING

FIG. 1 is a transmittance spectrum diagram of a cured film of HB-TmDAL-TN40 as prepared in Example 2-2.

EMBODIMENT FOR CARRYING OUT THE INVENTION

The present invention will hereinafter be described in further detail.

The solvent-free light-curable adhesive additive composition according to the present invention contains a triazine ring-containing polymer, which contains a recurring unit structure represented by the following formula (1) and has a weight average molecular weight of 500 to 7,000, and a reactive diluent represented by the formula (A), but does not contain any solvent.

It is to be noted that the term "adhesive" as used herein has a concept which also embraces a pressure-sensitive adhesive.

[Chemical Formula 6]

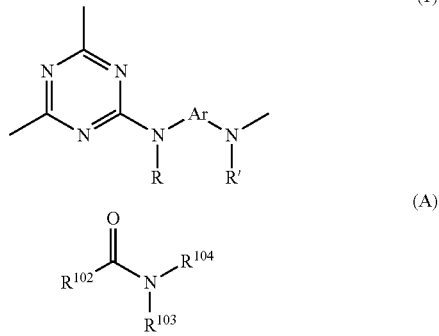

In the formula (1), R and R' each independently represent a hydrogen atom, an alkyl group, an alkoxy group, an aryl group, or an aralkyl group, but from the viewpoint of providing a higher refractive index, may be both preferably a hydrogen atom.

In the present invention, the number of carbons in the alkyl group is not particularly limited, but preferably 1 to 20, with having 1 to 10 carbons being more preferred and 1 to 3 being even more preferred from the viewpoint of providing a polymer of still higher heat resistance. The alkyl group may have a linear, branched or cyclic structure.

Specific examples of the alkyl group may include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons in the alkoxy group is not particularly limited, but preferably 1 to 20, with having 1 to 10 carbons being more preferred and 1 to 3 being even more preferred from the viewpoint of providing a polymer of still higher heat resistance. The alkyl moiety of the alkoxy group may have a linear, branched or cyclic structure.

Specific examples of the alkoxy group may include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons in the aryl group is not particularly limited, but preferably 6 to 40, with having 6 to 16 carbons being more preferred and 6 to 13 being even more preferred from the viewpoint of providing a polymer of still higher heat resistance.

Specific examples of the aryl group may include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons in the aralkyl group is not particularly limited, but preferably having 7 to 20 carbons. The alkyl moiety of the aralkyl group may have a linear, branched or cyclic structure.

Specific examples of the aralkyl group may include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

Ar represents at least one moiety selected from the group consisting of moieties represented by the following formulas (2) to (13):

[Chemical Formula 7]

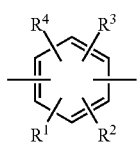

(2)

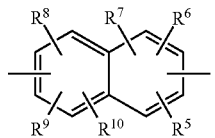

(3)

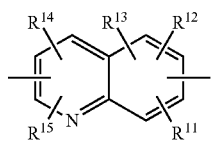

(4)

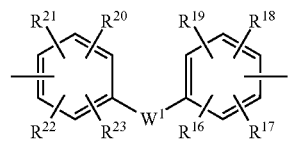

(5)

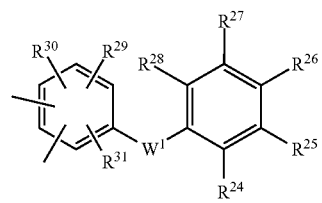

(6)

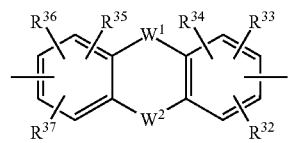

(7)

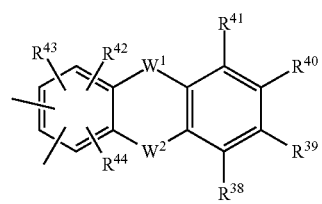

(8)

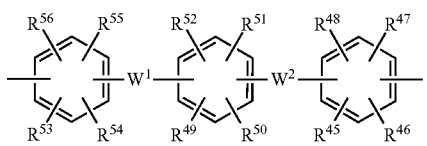

(9)

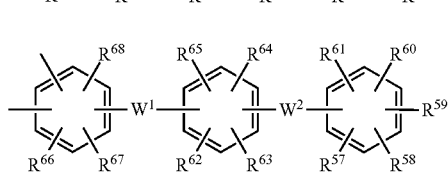

(10)

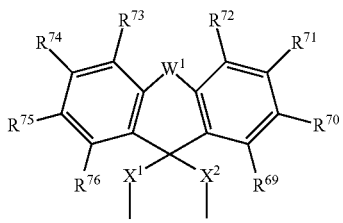

(11)

-continued

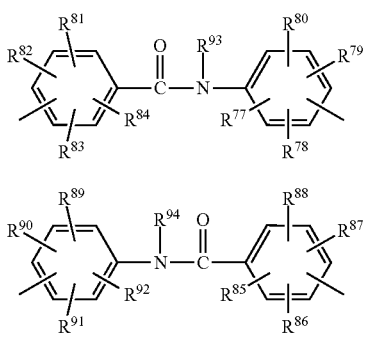

$R^1$ to $R^{92}$ reach independently represents a hydrogen atom, a halogen atom, a carboxyl group, a sulfo group, a linear or branched alkyl group having 1 to 10 carbons, or a linear or branched alkoxy group having 1 to 10 carbons, $R^{93}$ and $R^{94}$ each independently represent a hydrogen atom, or a linear or branched alkyl group having 1 to 10 carbons, $W^1$ and $W^2$ each independently represent a single bond, $CR^{95}R^{96}$ (in which $R^{95}$ and $R^{96}$ each independently represent a hydrogen atom or a linear or branched alkyl group having 1 to 10 carbons, with the proviso that $R^{95}$ and $R^{96}$ may be fused together to form a ring), C=O, O, S, SO, $SO_2$, or $NR^{97}$ (in which $R^9$ represents a hydrogen atom or a linear or branched alkyl group having 1 to 10 carbons).

Examples of the halogen atom may include fluorine, chlorine, bromine and iodine.

As those alkyl groups and alkoxy groups, those which are similar to the above-described ones may be mentioned.

$X^1$ and $X^2$ are each independently a single bond, a linear or branched alkylene group having 1 to 10 carbons, or a group represented by the formula (14) below:

[Chemical Formula 8]

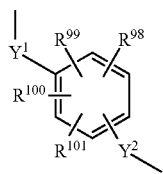

(14)

$R^{98}$ to $R^{101}$ each independently represent a hydrogen atom, a halogen atom, a carboxyl group, a sulfo group, an linear or branched alkyl group having 1 to 10 carbons, or a linear or branched alkoxy group having 1 to 10 carbons, and $Y^1$ and $Y^2$ each independently represent a single bond, or a linear or branched alkylene group having 1 to 10 carbons. As these halogen atom, alkyl group and alkoxy group, those which are similar to the above-described ones may be mentioned.

Specific examples of the linear or branched alkylene group having 1 to 10 carbons may include methylene, ethylene, propylene, trimethylene, tetramethylene and pentamethylene.

Among these, $R^1$ to $R^{92}$ and $R^{98}$ to $R^{101}$ may each preferably be a hydrogen atom, a halogen atom, a linear or branched alkyl group having 1 to 5 carbons, or a linear or branched alkoxy group having 1 to 5 carbons, with a hydrogen atom being more preferred.

In particular, Ar may be preferably at least one moiety selected from the group consisting of moieties represented by the formulas (2) and (5) to (13), and more preferably at least one moiety selected from the group consisting of the formulas (2), (5), (7), (8) and (11) to (13). Specific examples of allyl groups represented by the formulas (2) to (13) may include, but are not limited to, those represented by the following formulas:

[Chemical Formula 9]

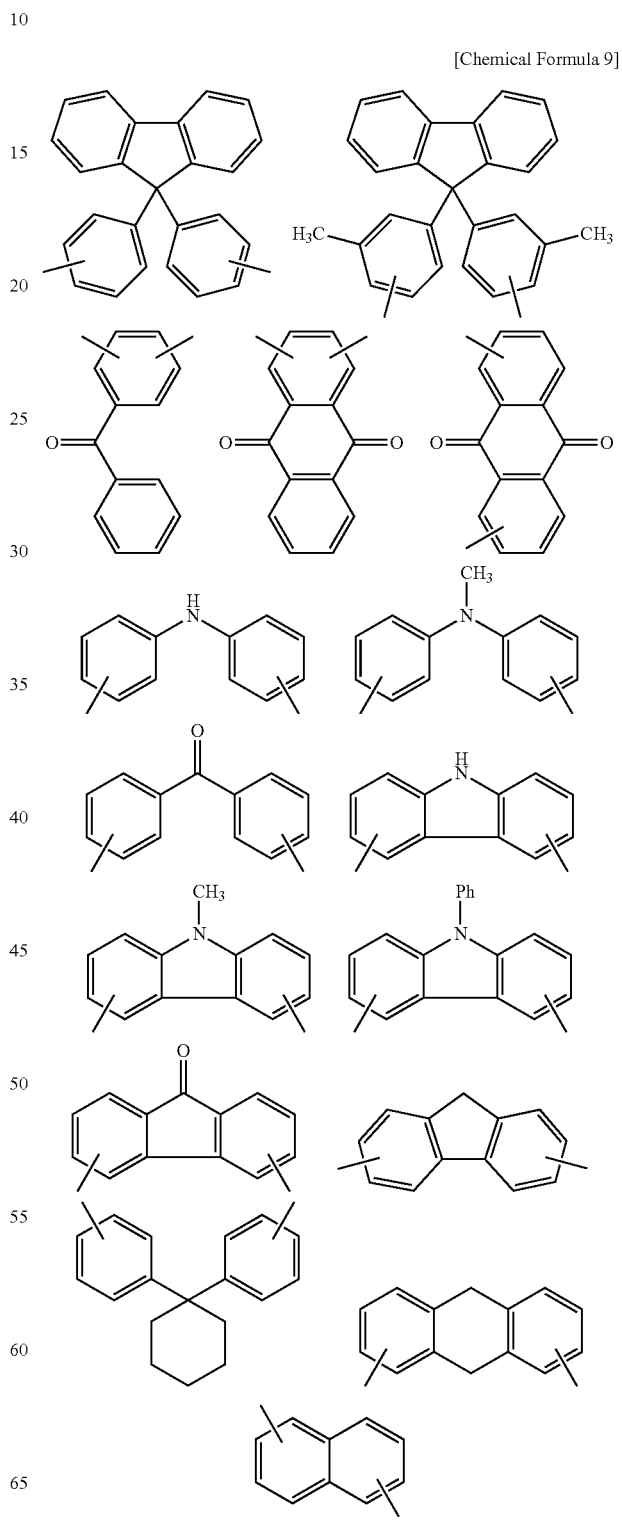

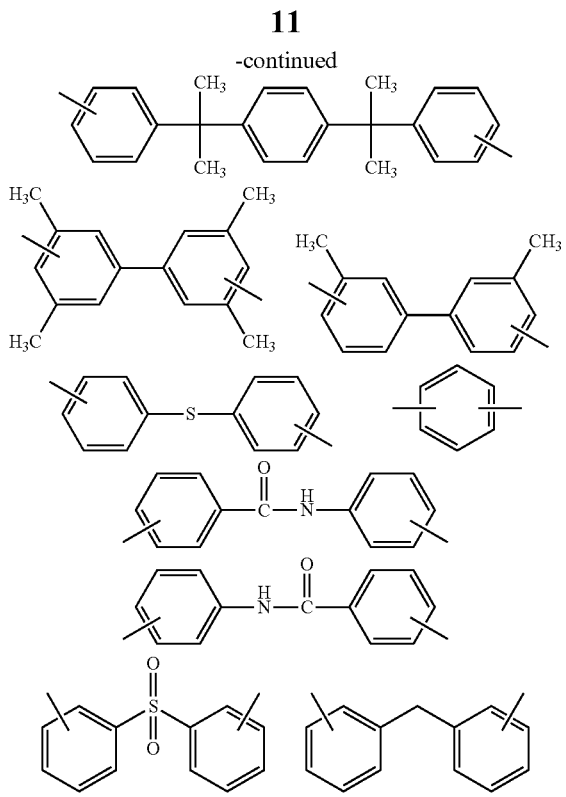
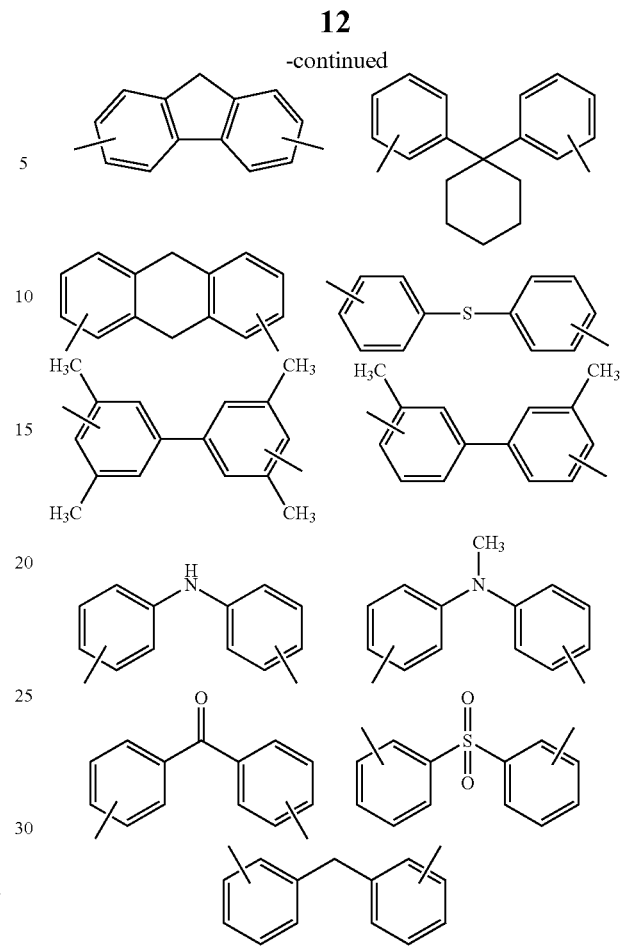

Of these, aryl groups represented by the formulas below are more preferred for the availability of polymers of even higher refractive indices.

[Chemical Formula 10]

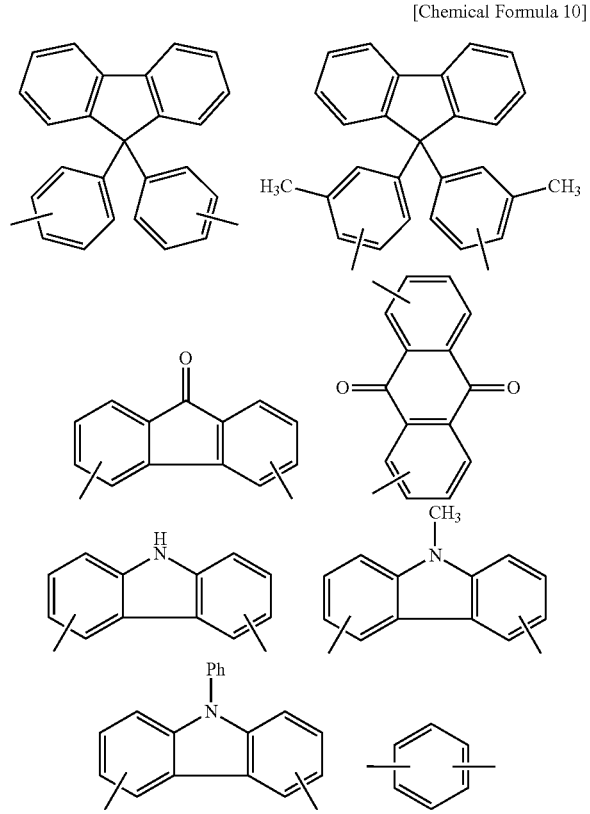

Especially from the viewpoint of providing the triazine ring-containing polymer with still higher solubility in the reactive diluent, an m-phenylene group represented by the following formula (15) is preferred as Ar.

[Chemical Formula 11]

(15)

As the triazine ring-containing polymer in the present invention, one including a recurring unit structure represented by the formula (16) is preferred, with one including a recurring unit structure represented by the formula (17) being more preferred.

[Chemical Formula 12]

(16)

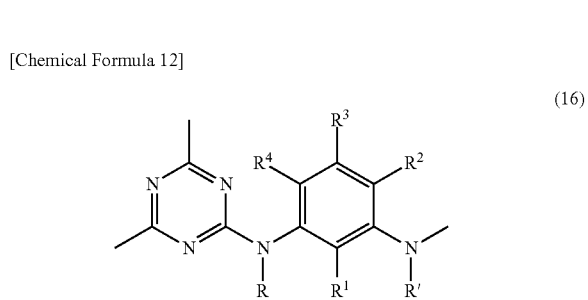

(In the formula, R, R' and $R^1$ to $R^4$ have the same meanings as described above.)

[Chemical Formula 13]

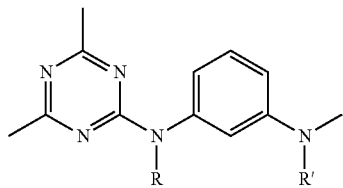

(17)

(In the formula, R and R' have the same meanings as described above.)

As the triazine ring-containing polymer for use in the present invention, a hyperbranched polymer represented by the following formula (18) is most suited.

[Chemical Formula 14]

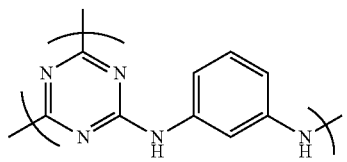

(18)

In the present invention, the weight-average molecular weight of the triazine ring-containing polymer represented by the formula (1) is set at 500 to 7,000 from the viewpoint of solubility with an adhesive ingredient such as an acrylic material, and from the viewpoint of providing higher solubility with the adhesive ingredient, its upper limit is preferably up to 6,000, most preferably up to 5,000. From the standpoint of further enhancing the heat resistance and lowering the shrinkage ratio, at least 1,000 is preferred, and at least 2,000 is more preferred.

The weight-average molecular weight in the present invention means a weight-average molecular weight measured by gel permeation chromatography (GPC) against a polystyrene standard.

The triazine ring-containing polymer in the present invention can be prepared following the method of Patent Document 4 mentioned above.

For example, as illustrated by Scheme 1 below, a hyperbranched polymer having a recurring unit structure (21) can be obtained by reacting a cyanuric halide (19) with an m-phenylenediamine compound (20) in a suitable organic solvent.

Scheme 1

[Chemical Formula 15]

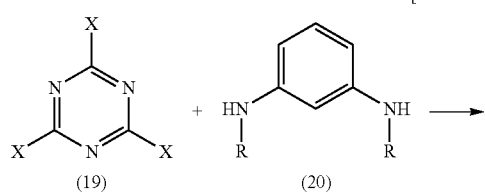

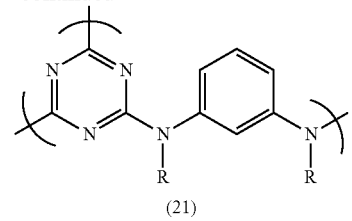

(21)

(In the formula, Xs each independently represent a halogen atom, and Rs have the same meaning as described above.)

As illustrated by Scheme 2 below, a hyperbranched polymer having the recurring structure (21) can be also synthesized from a compound (22) obtained by using and reacting equimolar amounts of the cyanuric halide (19) and the m-phenylenediamine compound (20) in a suitable organic solvent.

Scheme 2

[Chemical Formula 16]

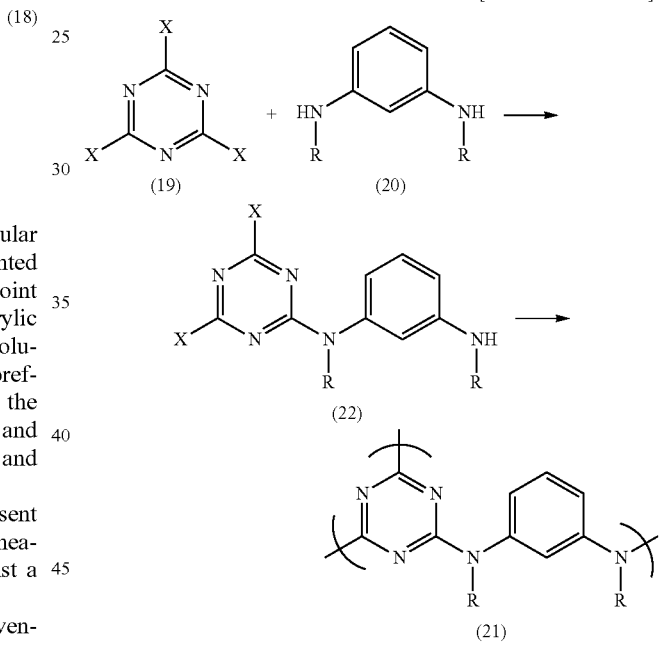

(In the formula, Xs each independently represent a halogen atom, and Rs have the same meaning as described above.)

In the processes of each of Schemes 1 and 2, the individual starting materials may be charged in any desired amounts insofar as the target polymer can be obtained, but the use of 0.01 to 10 equivalents of the diamino compound (29) per equivalent of the cyanuric halide (19) is preferred.

In the process of Scheme 1 in particular, it is preferable to avoid using 3 equivalents of the diamino compound (20) per 2 equivalents of the cyanuric halide (19). By shilling the amounts of the respective functional groups from their chemical equivalent ratio, formation of gelled matter can be prevented.

To obtain hyperbranched polymers of various molecular weights with many terminal triazine rings contained therein, it is preferred to use the diamino compound (20) in an amount of less than 3 equivalents per 2 equivalents of the cyanuric halide (19).

To obtain hyperbranched polymers of various molecular weights with many terminal amines contained therein, on the other hand, it is preferred to use the cyanuric halide (19) in an amount of less than 2 equivalents per 3 equivalents of the diamino compound (20).

By suitably regulating the amounts of the diamino compound (20) and the cyanuric halide (19) as described above, the molecular weight of the resulting hyperbranched polymer can be easily regulated.

As a method for regulating the molecular weight of the hyperbranched polymer, it is also possible to relying upon controlling the total concentration of both the compounds in the organic solvent. In this method, the total concentration (the solids concentration) of both the compounds may be preferably 1 to 100% by weight, more preferably 5 to 50% by weight, even more preferably 10 to 25% by weight.

Various solvents that are commonly used in this type of reactions may be used as the organic solvent. Specific examples may include, for example, tetrahydrofuran, dioxane, dimethyl sulfoxide; amide solvents such as N,N-dimethylformamide, N-methyl-2-pyrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethyl sulfoxide, N-methyl-2-pyrrolidone, N,N-dimethylacetamide, and mixed solvents thereof are preferred, with N,N-dimethylacetamide and N-methyl-2-pyrrolidone being especially suited.

In the reaction of Scheme 1 and the reaction of the second stage in Scheme 2, the reaction temperature may be suitably set in the range of the melting point to the boiling point of the used solvent. Especially, however, the temperature may be preferably 0° C. to 150° C., more preferably 60° C. to 100° C.

In the reaction of Scheme 1, in particular, from the standpoint of suppressing linearity and increasing the degree of branching, the reaction temperature may be preferably 60° C. to 150° C., more preferably 80° C. to 150° C., even more preferably 80° C. to 120° C.

From the viewpoint of obtaining the polymer of the above-mentioned weight average molecular weight, however, the mixing of the cyanuric halide (19) and the diamino compound (20) may preferably be conducted under low temperature, which may be preferably at approximately −50° C. to 50° C., more preferably at approximately −20° C. to 50° C., even more preferably −20° C. to 10° C. After the low-temperature charging, it is preferred to react both the compounds at the same temperature for a predetermined time, and then to raise the temperature at a stretch (in one stage) to a polymerization temperature to react them further.

In the process of the first stage of Scheme 2, the reaction temperature may be suitably set in the range of the melting point to the boiling point of the used solvent, with a temperature of approximately −50° C. to 50° C. being preferred, a temperature of approximately −20° C. to 50° C. being more preferred, a temperature of approximately −10° C. to 50° C. of so being even more preferred, and a temperature of −10° C. to 10° C. being still more preferred. In the process of Scheme 2 in particular, the adoption of a two-stage process, which consists of a first step involving a reaction at −50° C. to 50° C. and a second step involving a reaction at 60° C. to 150° C., is preferred.

In each of the above-described reactions, the individual ingredients may be added in any order. In the reaction of Scheme 1, however, preferred is a method that cools a solution containing one of the cyanuric halide (19) and the diamino compound (20) and the organic solvent and then adds, to the resulting solution, the remaining one of the cyanuric halide (19) and the diamino compound (20).

In this method, either ingredient may be used as the ingredient to be dissolved beforehand in the solvent or as the ingredient to be added later. From the viewpoint of obtaining the polymer with the above-mentioned weight average molecular weight, however, preferred is a method that adds the cyanuric halide (19) dropwise or in a powder form to a solution of the amino compound (20) while maintaining the internal temperature under the above-described low temperature.

It is preferred, after the mixing of both the compounds, to react them under the above-described low temperature for approximately 0.5 to three hours and then to raise the internal temperature at a stretch to 60° C. to 150° C. for polymerization.

In the reaction of the first stage in Scheme 2, either ingredient may be used as the ingredient to be dissolved beforehand in the solvent or as the ingredient to be added later, but preferred is a method that adds the diamino compound (20) to a cooled solution of the cyanuric halide (19). The addition may be gradually carried out by dropwise addition or the like, or the entire amount may be added all at once.

The ingredient to be added later may be added neat or may be added in the form of a solution in such an organic solvent as mentioned above. However, in view of the ease of operation and the controllability of the reaction, the latter method is preferred.

In the reaction of Scheme 1 and the reaction of the second stage in Scheme 2, desired one of various bases commonly used during or after polymerization may be added.

Specific examples of such bases may include potassium carbonate, potassium hydroxide, sodium carbonate, sodium hydroxide, sodium hydrogen carbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylamine, diisopropylethylamine, N-methylpiperidine, 2,2,6,6-tetramethyl-N-methylpiperidine, pyridine, 4-dimethylaminopyridine and N-methylmorpholine.

The amount of the base to be added is preferably 1 to 100 equivalents, more preferably 1 to 10 equivalents per equivalent of the cyanuric halide (19). Those bases may be used in the form of an aqueous solution.

In the process of each of the schemes, the product can be easily purified by reprecipitation or the like after completion of the reaction.

In the present invention, some of the halogen atoms on at least one terminal triazine ring may each be capped with an alkyl, aralkyl, aryl, alkylamino, alkoxysilyl-containing alkylamino, aralkylamino, arylamino, alkoxy, aralkyloxy, aryloxy or ester group.

Of these, an alkylamino, alkoxysilyl-containing alkylamino, aralkylamino or arylamino group is preferred. An alkylamino or arylamino group is more preferred. An arylamino group is even more preferred.

As the alkyl group and alkoxy group, those which are similar to the ones described above can be mentioned.

Specific examples of the ester group may include methoxycarbonyl and ethoxycarbonyl.

Specific examples of the aryl group include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3 phenanthryl, 4-phenanthryl and 9-phenanthryl.

Specific examples of the aralkyl group include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

Specific examples of the alkylamino group may include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl, n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Specific examples of the aralkylamino group include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Specific examples of the arylamino group may include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino.

The alkoxysilyl-containing alkylamino group may be any one of a monoalkoxysilyl-containing alkylamino group, a dialkoxysilyl-containing alkylamino group and a trialkoxysilyl-containing alkylamino group. Their specific examples may include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Specific examples of the aryloxy group may include phenoxy, naphthoxy, anthranyloxy, pyrenyloxy, biphenyloxy, terphenyloxy and fluorenyloxy.

Specific examples of the aralkyloxy group may include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy.

These groups can each be easily introduced by substituting a halogen atom on a triazine ring with a compound that provides the corresponding substituent. For example, as illustrated in Scheme 3 below, by adding and reacting an aniline derivative, a hyperbranched polymer (23) having a phenylamino group at least one end is obtained.

Scheme 3

[Chemical Formula 17]

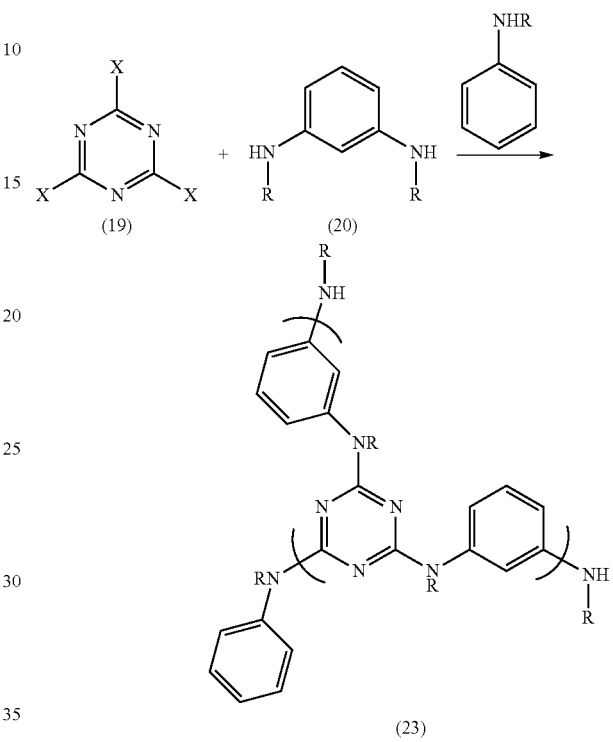

(In the formula, Xs and Rs have the same meanings as described above.)

In the process of Scheme 3, simultaneous addition of an organic monoamine is conducted. Described specifically, the cyanuric halide compound and the diaminoaryl compound are reacted in the presence of the organic monoamine, whereby a flexible hyperbranched polymer having a low degree of branching in which the stiffness of the hyperbranched polymer has been reduced can be obtained.

The hyperbranched polymer obtained in this manner is excellent in the solubility in the reactive diluent (the suppression of aggregation) and also in crosslinkability.

Here, as the organic monoamine, an alkylmonoamine, an aralkyl monoamine and an aryl monoamine may each be used.

Specific examples of the alkyl monoamine may include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Specific examples of the aralkyl monoamine may include benzylamine, p-methoxycarbonylbenzylamine, p-ethoxycarbonylphenylbenzyl, p-methylbenzylamine, m-methylbenzylamine and o-methoxybenzylamine.

Specific examples of the aryl monoamine include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this process, the amount of the organic monoamine to be used per equivalent of the cyanuric halide compound may be set preferably at 0.05 to 500 equivalents, more preferably at 0.05 to 120 equivalents, even more preferably at 0.05 to 50 equivalents.

From the standpoint of suppressing the linearity and increasing the degree of branching, the reaction temperature in this process may be preferably 60° C. to 150° C., more preferably 80° C. to 150° C., even more preferably 80° C. to 120° C.

However, the mixing of the three ingredients, that is, the organic monoamine, cyanuric halide compound and diaminoaryl compound may be carried out preferably under the low temperature mentioned above. Further, after the low-temperature charging, it is preferred to raise the internal temperature at a stretch (in a single stage) to the polymerization temperature and then to carry out the reaction.

Alternatively, after the mixing of the two ingredients, that is, the cyanuric halide compound and diaminoaryl compound is carried out under the low temperature mentioned above, the organic monoamine may be added under the low temperature, the internal temperature may be raised at a stretch (in a single stage) to the polymerization temperature, and the reaction may then be carried out.

The reaction of the cyanuric halide compound with the diaminoaryl compound in the presence of such an organic monoamine may be carried out using an organic solvent similar to those mentioned above.

In the reactive diluent represented by the formula (A), on the other hand, $R^{102}$ and $R^{104}$ each independently represent a hydrogen atom, a linear or branched alkyl group having 1 to 10 carbons or a polymerizable carbon-carbon double bond-containing group, and $R^{103}$ represents a hydrogen atom or a linear or branched alkyl group having 1 to 10 carbons. In the present invention, however, one of $R^{102}$ and $R^{104}$ is a polymerizable carbon-carbon double bond-containing group, but $R^{102}$ and $R^{104}$ are not both a polymerizable carbon-carbon double bond-containing group at the same time.

Of these, $R^{102}$ may preferably be a hydrogen atom or a methyl group, and from the standpoint of ensuring hydrogen bond formability with the triazine ring-containing polymer, $R^{103}$ may preferably be a hydrogen atom.

Specific examples of the linear or branched alkyl group having 1 to 10 carbons may include methyl, ethyl, n-propyl, isopropyl, n-butyl, isobutyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, n-heptyl, n-octyl, 2-ethylhexyl, n-nonyl and n-decyl.

Of these, alkyl groups having 1 to 5 carbons are preferred.

The polymerizable carbon-carbon double bond-containing group is not particularly limited, but may preferably be a carbon-carbon double bond-containing hydrocarbon group (alkenyl group) having 2 to 10 carbons, preferably 2 to 5 carbons. Specific examples may include ethenyl (vinyl), n-1-propenyl, n-2-propenyl (allyl), 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-2-pentenyl, n-3-pentenyl, n-4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, n-1-hexenyl, n-2-hexenyl, n-3-hexenyl, n-4-hexenyl, n-5-hexenyl, n-heptenyl, n-octenyl, n-nonenyl and n-decenyl.

Specific examples of the reactive diluent represented by the formula (A) may include N-vinylformamide, N-vinylacetamide, N-allylformamide, N-allylacetamide, 4-acryloylmorpholine, (meth)acrylamide, N-methyl (meth)acrylamide, N-dimethyl (meth)acrylamide, N-ethyl (meth)acrylamide, N-diisopropyl (meth)acrylamide, N-isopropyl (meth)acrylamide and N-diisopropyl (meth)acrylamide. Of these, N-vinylformamide, 4-acryloymorpholine, N-dimethylacrylamide and N-diethyl (meth)acrylamide are preferred.

At least two reactive diluents may be used in combination.

No particular limitation is imposed on the amount of the reactive diluent which is represented by the formula (A) and is to be used. However, the reactive diluent may be preferably used in an amount of 1 to 200 parts by weight per 100 parts by weight of the triazine ring-containing polymer. In view of the extent of an improvement in the refractive index of the resulting adhesive film, its lower limit may be preferably 5 parts by weight, more preferably 10 parts by weight, while its upper limit may be preferably 150 parts by weight, more preferably 100 parts by weight.

Insofar as the triazine ring-containing polymer represented by the formula (1) and the reactive diluent represented by the formula (A) are contained, the adhesive additive composition of the present invention may be composed of these two ingredients only, or may contain, in addition to these two ingredients, one or more other additives such as a leveling agent, a surfactant and/or a silane coupling agent.

Specific examples of the surfactant may include, for example, nonionic surfactants such as polyoxyethylene alkyl ethers like polyoxyethylene lauryl ether, polyoxyethylene stearyl ether, polyoxyethylene cetyl ether and polyoxyethylene oleyl ether, polyoxyethylene alkylaryl ethers like polyoxyethylene octylphenol other and polyoxyethylene nonylphenol ether, polyoxyethylene-polyoxypropylene block copolymers, sorbitan fatty acid esters like sorbitan monolaurate, sorbitan monopalmitate, sorbitan monostearate, sorbitan monooleate, sorbitan trioleate and sorbitan tristearate, and polyoxyethylene sorbitan fatty acid esters like polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorosurfactants such as Eftop EF301, EF303 and EF352 (tradenames, products of Mitsubishi Materials Electronic Chemicals Co., Ltd., formerly Jemco Inc.), Megafac F171, F173, R-08, R-30, R-40, F-553, F-554, RS-75 and RS-72-K (tradenames, products of DIC Corporation), Fluorad FC430 and FC431 (tradenames, products of Sumitomo 3M, Ltd.), AsahiGuard AG710 and Surflon S-382, SC101, SC102, SC103, SC104, SC105 and SC106 (tradenames, products of Asahi Glass Co., Ltd.); and Organosiloxane Polymer KP341 (tradename, product of Shin-Etsu Chemical Co., Ltd.), BYK-302, BYK-307, BYK-322, BYK-323, BYK-330, BYK-333, BYK-370, BYK-375 and BYK-378 (tradenames, products of BYK-Chemie Japan KK), and KL-402, KL-404, LE-604 and LE-605 (tradenames, products of Kyoeisha Chemical Co., Ltd.).

These surfactants may be used singly, or at least two of them may be used in combination. The amount of the surfactant to be used may be preferably 0.0001 to 5 parts by weight, more preferably 0.001 to 1 part by weight, even more preferably 0.01 to 0.5 part by weight per 100 parts by weight of the triazine ring-containing polymer.

The adhesive additive composition of the present invention is used for the purpose of adjusting the refractive index of an adhesive film available from a solvent-free light-curable adhesive.

As the manner of its use, the adhesive additive composition may be added to an adhesive (composition), the adhesive (composition) may be added to the adhesive additive composition, or an adhesive ingredient may be incorporated in the adhesive additive composition to formulate an adhesive (composition).

As a monomer that makes up the adhesive ingredient in the solvent-free light-curable adhesive, no particular limitation is imposed, and from known monomers such as acrylic monomers and allyl monomers, a monomer can be suitably selected and used. The triazine ring-containing polymer used in the adhesive additive composition of the present invention has excellent compatibility especially with (meth) acrylic monomers and oligomers, and therefore are preferably applied to acrylic light-curable adhesives that contain such monomers as adhesive ingredients.

Specific examples of the allyl monomers may include triallyl cyanurate and triallyl isocyanurate.

No particular limitation is imposed on the (meth)acrylic monomers insofar as they have been commonly used as adhesive ingredients to date. Specific examples of the (meth) acrylic monomers may include methyl (meth)acrylate, ethyl (meth)acrylate, butyl (meth)acrylate, 2-(2-ethoxyethoxy) ethyl acrylate, tetrahydrofurfuryl (meth)acrylate, lauryl acrylate, isooctyl acrylate, isodecyl acrylate, 2-phenoxyethyl acrylate, 2-ethylhexyl (meth)acrylate, isobornyl (meth) acrylate, adamantly (meth)acrylate, dicyclopentenyloxyethyl (meth)acrylate, dicyclopentadienyl (meth)acrylate, 2-hydroxyethyl (meth)acrylate, 2-hydroxypropyl (meth) acrylate, 2-hydroxybutyl (meth)acrylate, caprolactone acrylate, morpholine (meth)acrylate, hexanediol di(meth)acrylate, ethylene glycol dimethacrylate, trimethylolpropane triacrylate, pentaerythritol tetrahydrofuran acrylate, and urethane acrylate.

Examples of commercial (meth)acrylic monomers may include EBECRYL (registered trademark) 80, 436, 438, 446, 450, 505, 524, 525, 770, 800, 810, 811, 812, 830, 846, 851, 852, 853, 1870, 884, 885, 600, 605, 645, 648, 860, 1606, 3500, 3608, 3700, 3701, 3702, 3703, 3708, 6040, 303, and 767 (tradenames, products of Daicel-Cytec Co., Ltd.); NK Ester A-200, A-400, A-600, A-1000, A-9300 (tris(2-acryloyloxyethyl) isocyanurate), A-9300-ICL, A-DPH, A-TMPT, A-DCP, A-HD-N, UA-53H, 10, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E, ATM-35E, TMPT, DCP, NPG, HD-N, A-LEN-10, and NK Polymer Vanaresin GH-1203 (tradenames, all, products of Shin-Nakamura Chemical Co., Ltd.); KAYARAD (registered trademark) DPEA-12, PEG400DA, THE330, RP-1040, DPHA, NPGDA, and PET30 (tradenames, all, products of Nippon Kayaku Co., Ltd.); and M-210 and M-350 (tradenames, both, products of Toagosei Co., Ltd.)

Urethane acrylate is a compound that contains at least one polymerizable unsaturated bonds and at least two urethane bonds, and is also available as commercial products. Its specific examples may include BEAMSET (registered trademark) 102, 502H, 505A-6, 510, 550B, 551B, 575, 575CB, EM-90, and EM-92 (tradenames, products of Arakawa Chemical Industries, Ltd.); Photomer (registered trademark) 6008 and 6210 (tradenames, products of San Nopco Limited; NK Oligo U-2PPA, U-4HA, U-6HA, U-15HA, UA-32P, U-324A, U-411, U-6H, UA-160™ (reaction product of 2-hydroxyethyl acrylate, isophorone diisocyanate and polytetramethylene glycol), UA-122P, UA-2235PE, UA-340P, UA-5201, and UA-512 (tradenames, products of Shin-Nakamura Chemical Co., Ltd.); ARONIX (registered trademark) M-1100, M-1200, M-1210, M-1310, M-1600, M-1960, and M-5700 (tradenames, products of Toagosei Co., Ltd.); AH-600, AT606, UA-306H, and UF-8001 (tradenames, products of Kyoeisha Chemical Co., Ltd.); KAYARAD (registered trademark) UX-2201, UX-2301, UX-3204, UX-3301, UX-4101, UX-6101, and UX-7101 (tradenames, products of Nippon Kayaku Co., Ltd.); SHI-KOH (registered trademark) UV-1700B, UV-3000B, UV-6100B, UV-6300B, UV-7000, UV-7600B, UV-7640B, UV-7605B, UV-2010B, UV-6630B, UV-7510B, UV-7461TE, UV-3310B, and UV-6640B (trade names, products of The Nippon Synthetic Chemical Industry Co., Ltd.); Art-Resin UN-1255, UN-5200, UN-7700, UN-333, UN-905, HDP-4T, HMP-2, UN-901T, UN-3320HA, UN-3320HB, UN-3320HC, UN-3320HS, H-61, HDP-M20, UN-5500, and UN-5507 (tradenames, products of Negami Chemical Industrial Co., Ltd.); EBECRYL (registered trademark) 6700, 204, 205, 210, 215, 220, 6202, 230, 244, 245, 254, 264, 265, 270, 280/151B, 284, 285, 294/25HD, 1259, 1290K, 1748, 2002, 2220, 4820, 4833, 4842, 4858, 4866, 5129, 6602, 8210, 8301, 8307, 8402, 8405, 8411, 8804, 8807, 9260, 9270, 8311, 8701, 9227EA, KRM-8200, KRM-7735, KRM-8296, and KRM-8452 (tradenames, products of Daicel-Cytec Co., Ltd.); and UV-curable Urethane Acrylate 8UX-015A (tradename, product of Taisci Fine Chemical Co., Ltd.).

No particular limitation is imposed on the use ratio of the adhesive additive composition to the allyl or (meth)acrylic monomer, insofar as in the above-mentioned concentration range of the triazine ring-containing polymer in the adhesive additive composition, the triazine ring-containing polymer and the allyl or (meth)acrylic monomer are miscible with each other into a uniform solution. The mass ratio of the triazine ring-containing polymer to the allyl or (meth)acrylic monomer may be set at approximately 1:10 to 10:1. From the viewpoint of providing the resulting adhesive film with a higher refractive index, the mass ratio may be preferably 1:7 to 7:1, more preferably 1:5 to 5:1, even more preferably 1:3 to 3:1.

To the adhesive of the present invention with the adhesive additive composition and the adhesive monomer contained therein, a photoradical polymerization initiator may be also added.

As the photoradical polymerization initiator, any desired one can be suitably selected and used. Examples may include acetophenones, benzophenones, Michler's benzoyl benzoate, amyloxime esters, oxime ester, tetramethylthiuram monosulfide and thioxanthones.

Photocleavable photoradical polymerization initiators are especially preferred. Photocleavable photoradical polymerization initiators are described in "Recent UV Curing Technologies" (in Japanese) (page 159, Publisher: TAKAUSU, Kazuhiro, Publishing Office: Gijutsu Joho Kyokai KK; 1991).

Examples of commercial photoradical polymerization initiators include Irgacure 127, 184, 369, 379, 379EG, 651, 500, 754, 819, 903, 907, 784, 2959, CGI1700, CGI1750, CGI1850, CG24-61, OXE01 and OXE02, and Darocur 1116 and 1173 and MBF (tradenames, product of BASF SE); Lucirin TPO (tradename, product of BASF SE); Ubecryl P36 (tradename, product of UCB); Esacure KIP150, KIP65LT, KIP100F, KT37, KT55, KT046 and KIP75/B (tradenames, products of Fratelli Lamberti Company).

When the photoradical polymerization initiator is used, it may be used preferably in a range of 0.1 to 200 parts by weight, more preferably in a range of 1 to 150 parts by weight, per 100 parts by weight of the (meth)acrylic monomer.

In the adhesive of the present invention, one or more of known radical polymerizable monomers, oligomers and/or polymers other than the above-mentioned allyl or (meth) acrylic monomers may be contained, and in addition, one or more of known additives such as the above-mentioned surfactants, antioxidants, UV absorbers, adhesion promoters, thickeners, flame retardants, and the like.

The adhesive of the present invention can be formed into an adhesive layer by coating it to a base material, laminating the base material and a material, which is to be adhered, together, and then exposing them to light.

A desired coating method can be used for the adhesive. For example, a method such as spin coating, dip coating, flow coating, inkjet printing, jet dispenser coating, spray coating, bar coating, gravure coating, slit coating, roll coating, transfer printing, brush coating, blade coating or air knife coating can be adopted.

Specific examples of the base material include silicon, indium-tin oxide (ITO)-coated glass, indium zinc oxide (IZO)-coated glass, and base materials formed of polyethylene terephthalate (PET), plastics, glass, quartz and ceramics. Use can also be made of flexible base materials having pliability.

No particular limitation is imposed on conditions under which light exposure is carried out, and appropriate exposure energy and time can be adopted according to the triazine ring-containing polymer and (meth)acrylic monomer to be used.

The adhesive layer of the present invention obtained as described above is not only excellent in transparency but also improved in refractive index. Accordingly, the use of this adhesive layer can reduce its difference in refractive index from an adhered layer. As a consequence, it is possible to provide electronic devices and optical devices with improved visibility and light extraction efficiency.

The adhesive which contains the adhesive additive composition of the present invention is suited as an adhesive for devices for which transparency and a high refractive index are required, such as liquid-crystal displays, organic electroluminescence (EL) displays, touch panels, optical semiconductor (LED) devices, solid-state image sensors, organic thin-film solar cells, dye-sensitized solar cells, organic thin-film transistors (TFTs), and electronic devices and optical devices such as lenses, prisms, cameras, binoculars, microscopes and semiconductor exposure systems.

EXAMPLES

Examples and Comparative Examples will hereinafter be described to illustrate the present invention more specifically. It is, however, to be noted that the present invention is by no means limited to the following Examples. Measurement instruments used in the Examples were as follows.

| (1) Gel permeation chromatography (GPC) | |
|---|---|
| Instrument: | SCL-10Avp (manufactured by Shimadzu Corporation; modified for GPC) |
| Columns: | Shodex K-804L + K-805L |
| Column temperature: | 60° C. |
| Solvent: | N-methyl-2-pyrrolidone (0.1% LiCl added) |
| Detector: | UV (254 nm) |
| Calibration curve: | polystyrene standard |
| (2) Total light transmittance, Haze | |
| Instrument: | NDH5000 (manufactured by Nippon Denshoku Industries Co., Ltd.) |
| (3) Refractive index (thin film) | |
| Instrument: | Multiple Incident Angle Spectroscopic Ellipsometer VASE (manufactured by J.A. Woollam Japan Corp.) |
| (4) Refractive index (thick film) | |
| Instrument: | Metricon 2010/M Prism Coupler (manufactured by Metricon Corporation) |
| (5) UV-VIS-NIR spectrophotometer | |
| Instrument: | UV-3600 (manufactured by Shimadzu Corporation) |
| (6) Thermogravimetric-Differential Thermal Analyzer (TG-DTA) | |
| Instrument: | TG-8120 (manufactured by Rigaku Corporation) |
| Temperature ramp-up rate: | 10° C./minute |
| Measurement temperatures: | 20° C. to 500° C. |
| (7) DSC | |
| Instrument: | DSC 204F1 Phoenix (manufactured by NETZSCH-Geratebau GmbH) |
| Temperature ramp-up rate: | 30° C./minute |
| Measurement temperatures: | 25° C. to 300° C. |
| (8) Liquid refractive index | |
| Instrument: | Multi-wavelength Abbe Refractometer DR-M4 (manufactured by ATAGO CO., LTD.) |
| Measurement wavelength: | 589 nm |
| Measurement temperatures: | 20° C. |
| (9) Tensile shear adhesion strength | |
| Instrument: | Shimadzu Universal Testing Instruments Autograph (manufactured by Shimadzu Corporation) |

[1] Synthesis of Triazine Ring-Containing Polymers

[Synthesis Example 1] Synthesis of Polymeric Compound [3]

[Chemical Formula 18]

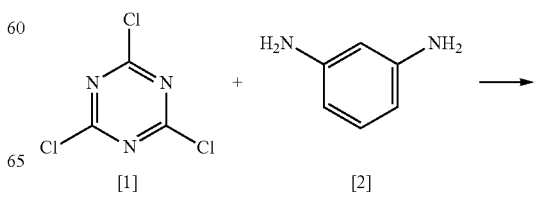

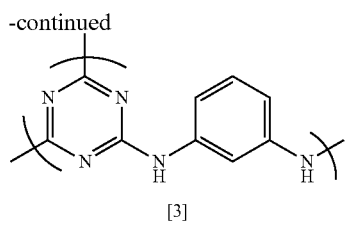

[3]

Under a nitrogen atmosphere, 8.80 g (81.3 mmol) of 1,3-phenylenediamine [1](product of Aminochem Company), 2.53 g (27.1 mmol) of aniline (product of JUNSEI CHEMICAL CO., LTD.) and 288.0 g of N,N-dimethylacetylamide (product of JUNSEI CHEMICAL CO., LTD.; hereinafter abbreviated as "DMAc") were charged into a 500 mL four-neck flask, followed by cooling to −15° C. Twenty grams (108.5 mmol) of 2,4,5-trichloro-1,3,5-triazine [2] (product of Evonik Degussa GmbH) were added in a powder form into the resulting amine solution over ten minutes while maintaining the amine solution at internal temperatures of −15° C. to −10° C. Subsequently, the resulting mixture was stirred at −10° C. for one hour, the reaction solution so prepared was added dropwise over 30 minutes by a fluid transfer pump into a 1,000 mL four-neck flask as a reactor in which 235.8 g of DMAc (product of JUNSEI CHEMICAL CO., LTD.) had been added and heated to 85° C. beforehand over an oil bath, and the resulting mixture was stirred for two hours to conduct polymerization.

Subsequently, 26.9 g (288.5 mmol) of aniline (product of JUNSEI CHEMICAL CO., LTD.) was added, followed by stirring for three hours to complete a reaction. The reaction solution was cooled to room temperature in an ice bath, and was then subjected to reprecipitation in a mixed solution of 65.9 g of a 28% aqueous ammonia solution and 1,000 g of deionized water. A precipitate was collected by filtration to obtain a wet product of polymer. The wet product of polymer so obtained was redissolved in a mixed solution of 280 g of tetrahydrofuran (hereinafter abbreviated as "THF") and 65.9 g of a 28% aqueous ammonia solution. The resulting solution was stirred for 30 minutes, heated to 40° C., and then allowed to separate into layers. The organic layer was collected, and then subjected to reprecipitation in 1,500 g of deionized water in which a small amount of ammonium acetate was dissolved. The resulting precipitate was collected by filtration, and then dried at 130° C. for eight hours in a vacuum dryer to afford 23.2 g of the target polymeric compound [3] (hereinafter simply referred to as "HB-TmDAL-T").

The polystyrene-equivalent weight average molecular weight Mw of HB-TmDAL-T as measured by GPC was 3,330, and its polydispersity Mw/Mn was 2.68.
[Thermal Analysis of Polymer]

With respect to HB-TmDAL-T, its glass transition temperature (Tg) and 5% weight loss temperature ($Td_{5\%}$) were measured by DSC and TG-DTA, respectively, and as a result, Tg was 131.5° C. and $Td_{5\%}$ was 360.5° C.

[Synthesis Example 2] Synthesis of Polymeric Compound [3]

Under a nitrogen atmosphere, 35.18 g (32.5 mmol) of 1,3-phenylenediamine (product of Aminochem Company), 10.10 g (108.5 mmol) of aniline (product of JUNSEI CHEMICAL CO., LTD.) and 716.9 g of DMAc (product of JUNSEI CHEMICAL CO., LTD.) were charged into a 1,000 mL four-neck flask, followed by cooling to −15° C. Eighty grams (433.8 mmol) of 2,4,5-trichloro-1,3,5-triazine (product of Evonik Degussa GmbH) were added in a powder form into the resulting amine solution over 30 minutes while maintaining the amine solution at internal temperatures of −15° C. to −10° C. Subsequently, the resulting mixture was stirred at −10° C. for one hour, the reaction solution so prepared was added dropwise over 45 minutes by a fluid transfer pump into a 2,000 mL four-neck flask as a reactor in which 586.4 g of DMAc (product of JUNSEI CHEMICAL CO., LTD.) had been added and heated to 85° C. beforehand over an oil bath, and the resulting mixture was stirred for two hours to conduct polymerization.

Subsequently, 107.4 g (1,154.0 mmol) of aniline (product of JUNSEI CHEMICAL CO., LTD.) was added, followed by stirring for three hours to complete a reaction. The reaction solution was cooled to room temperature in an ice bath, and was then subjected to reprecipitation in a mixed solution of 263.9 g of a 28% aqueous ammonia solution and 4,000 g of deionized water. A precipitate was collected by filtration to obtain a wet product of polymer. The wet product of polymer so obtained was redissolved in a mixed solution of 1.120 g of THF and 263.9 g of a 28% aqueous ammonia solution. The resulting solution was stirred for 30 minutes, heated to 40° C., and then allowed to separate into layers. The organic layer was collected, and then subjected to reprecipitation in 6,000 g of deionized water in which a small amount of ammonium acetate was dissolved. The resulting precipitate was collected by filtration, and then dried at 130° C. for eight hours in a vacuum dryer to afford 53.0 g of the target polymeric compound [3] (hereinafter simply referred to as "HB-TmDAL-T2").

The polystyrene-equivalent weight average molecular weight Mw of HB-TmDAL-T2 as measured by GPC was 4,855, and its polydispersity Mw/Mn was 2.31.
[Thermal Analysis of Polymer]

With respect to HB-TmDAL-T2, its glass transition temperature (Tg) and 5% weight loss temperature ($Td_{5\%}$) were measured by DSC and TG-DTA, respectively, and as a result, Tg was 169.3° C. and $Td_{5\%}$ was 394.5° C.

[Synthesis Example 3] Synthesis of Polymeric Compound [3]

Under a nitrogen atmosphere, 17.59 g (162.7 mmol) of 1,3-phenylenediamine (product of Aminochem Company), 5.05 g (54.2 mmol) of aniline (product of JUNSEI CHEMICAL CO., LTD.) and 358.4 g of DMAc (product of JUNSEI CHEMICAL CO., LTD.) were charged into a 500 mL four-neck flask, followed by cooling to −15° C. Forty grams (216.9 mmol) of 2,4,5-trichloro-1,3,5-triazine (product of Evonik Degussa GmbH) were added in a powder form into the resulting amine solution over ten minutes while maintaining the amine solution at internal temperatures of −15° C. to −10° C. Subsequently, the resulting mixture was stirred at −10° C. for one hour, the reaction solution so prepared was added dropwise over 30 minutes by a fluid transfer pump into a 1,000 mL four-neck flask as a reactor in which 293.2 g of DMAc (product of JUNSEI CHEMICAL CO., LTD.) had been added and heated to 85° C. beforehand over an oil bath, and the resulting mixture was stirred for two hours to conduct polymerization.

Subsequently, 53.7 g (576.9 mmol) of aniline (product of JUNSEI CHEMICAL CO., LTD.) was added, followed by stirring for three hours to complete a reaction. The reaction solution was cooled to room temperature in an ice bath, and was then subjected to reprecipitation in a mixed solution of 131.9 g of a 28% aqueous ammonia solution and 2,000 g of deionized water. A precipitate was collected by filtration to obtain a wet product of polymer. The wet product of polymer so obtained was redissolved in a mixed solution of 560 g of THF and 131.9 g of a 28% aqueous ammonia solution. The resulting solution was stirred for 30 minutes, heated to 40° C., and then allowed to separate into layers. The organic layer was collected, and then subjected to reprecipitation in 3,000 g of deionized water in which a small amount of ammonium acetate was dissolved. The resulting precipitate was collected by filtration, and then dried at 130° C. for eight hours in a vacuum dryer to afford 46.0 g of the target polymeric compound [3] (hereinafter simply referred to as "HB-TmDAL-T3").

The polystyrene-equivalent weight average molecular weight Mw of HB-TmDAL-T3 as measured by (PC was 4,198, and its polydispersity Mw/Mn was 2.29.

[Thermal Analysis of Polymer]

With respect to HB-TmDAL-T3, its glass transition temperature (Tg) and 5% weight loss temperature ($Td_{5\%}$) were measured by DSC and TG-DTA, respectively, and as a result, Tg was 152.6° C. and $Td_{5\%}$ was 393.3° C.

[Comparative Synthesis Example 1] Synthesis of Polymeric Compound [3]

Under a nitrogen atmosphere, 66.1 g of DMAc was cooled to −15° C. in a 200 mL four-neck flask in an acetone/dry ice bath, and 18.44 g (0.1 mol) of 2,4,6-trichloro-1,3,5-triazine (product of Evonik Degussa GmbH) was and dissolved. Subsequently, in a 300 mL four-neck flask, a solution of 13.52 g (0.125 mol) of m-phenylenediamine (product of E.I. du Pont de Nemours and Company) in 99.14 g of DMAc was cooled to −15° C., followed by dropwise addition over 120 minutes of the DMAc solution of 2,4,6-trichloro-1,3,5-triazine which had been cooled beforehand to −15° C. After the dropwise addition, the resulting mixture was stirred for 30 minutes, followed by dropwise addition of 3.17 g (0.034 mol) of aniline over 15 minutes. The resulting mixture was stirred for 30 minutes after the dropwise addition, and the reaction solution so prepared was added dropwise over 30 minutes by a fluid transfer pump into a 500 mL four-neck flask as a reactor in which 135.18 g of DMAc had been added and heated to 90° C. beforehand over an oil bath, and the resulting mixture was stirred for two hours to conduct polymerization.

Subsequently, 24.77 g (0.266 mmol) of aniline was added, the resulting mixture was stirred for three hours, and a reaction was then terminated. The reaction solution was allowed to cool down to room temperature, and was then subjected to reprecipitation in a mixed solution of 60.71 g of a 28% aqueous ammonia solution and 922.1 g of deionized water. A precipitate was collected by filtration, a wet product of polymer so obtained was added to a mixed solution of 258.2 g of THF and 60.71 g of a 28% aqueous ammonia solution, and the resulting solution was stirred for 30 minutes at 40° C. Subsequent to the stirring, the resulting mixture was allowed to stand for 30 minutes and separate into layers. The organic layer was collected. After the concentration of the organic layer so collected was adjusted with THF, 60.71 g of a 28% aqueous ammonia solution was added. The resulting mixture was stirred at 40° C., and then allowed to separate into layers to extract an organic layer. The concentration of the organic layer was adjusted. The resulting solution was then subjected to reprecipitation in a mixed solution of 94.11 g of a 28% aqueous ammonia solution and 1,383 g of deionized water. The resulting precipitate was collected by filtration, and then dried at 150° C. for 20 hours in a vacuum dryer to afford 25.7 g of the target polymeric compound [3] (hereinafter simply referred to as "HB-TmDA").

The polystyrene-equivalent weight average molecular weight Mw of HB-TmDA as measured by GPC was 10,200, and its polydispersity Mw/Mn was 6.5.

[Thermal Analysis of Polymer]

With respect to HB-TmDA, its glass transition temperature (Tg) and 5% weight loss temperature ($Td_{5\%}$) were measured by DSC and TG-DTA, respectively, and as a result, Tg was 200.0° C. and $Td_{5\%}$ was 418.5° C.

[Measurement of Refractive Index of Polymer]

Under air, 0.4000 g portions of the polymeric compounds obtained above in Synthesis Examples 1 to 3 were added to 10 mL sample bottles. 1.6000 g portions of cyclopentanone were added as a solvent to the polymeric compounds. Using a mixing rotor at 110 rpm, the polymeric compounds were completely dissolved at room temperature, followed by further stirring for one hour until the resulting solutions became uniform. After the stirring, the solutes were completely dissolved, whereby as clear, pale yellow solutions, polymer varnishes having a solid content of 20% by weight were obtained.

Using a spin coater, the polymer varnishes were separately spin-coated on quartz substrates under the conditions of 1,000 rpm and 30 seconds, followed by baking on a hot plate of 130° C. for three minutes under the atmosphere so that thin films were obtained. The refractive indices of the thin films were 1.764 for HB-TmDAL-T, 1.764 for HB-TmDAL-T2, and 1.756 for HB-TmDAL-T3 at 550 nm wavelength. Therefore, all the polymeric compounds exhibited at least 1.75, and were found to be materials of high refractive index.

[2] Compatibility with Acrylate Resin

Example 1-1

Under air, 4.0000 g of the triazine-based, hyperbranched polymer HB-TmDAL-T obtained in Synthesis Example 1 was added to a 10 mL sample bottle. 6.0000 g of N-vinylformamide (hereinafter abbreviated as "NVF") was added as a reactive diluent to the triazine-based, hyperbranched polymer HB-TmDAL-T. Using a mixing rotor at 110 rpm, the contents were stirred at room temperature until the polymer was completely dissolved and the resulting solution became uniform. After the stirring, an adhesive additive composition with the triazine-based, hyperbranched polymer contained at 40% by weight was obtained as a clear, pale yellow solution in which the polymer was completely dissolved.

Next, to 0.6000 g of the 40% by weight adhesive additive composition, 1.4000 g of isobornyl acrylate (product of Osaka Organic Chemical Industry Ltd.; hereinafter abbreviated as "IBXA") was added (mass ratio 3:7). The contents were stirred until the solute was completely dissolved and the resulting solution became uniform, whereby a polymer varnish was obtained.

Examples 1-2 and 1-3

Polymer varnishes were obtained in a similar manner as in Example 1-1 except that the mass ratio of the 40% by weight adhesive additive composition to IBXA was changed to 5:5 and 8:2, respectively.

Comparative Examples 1-1 to 1-3

Polymer varnishes, in which the respective mass ratio of the 40% by weight adhesive additive composition to IBXA was 3:7, 5:5 and 8:2 were obtained in a similar manner as in Examples 1-1 to 1-3 except that the triazine-based, hyperbranched polymer HB-TmDA obtained in Comparative Synthesis Example 1 was used.

The individual adhesive additive compositions formulated above were evaluated for compatibility. The compatibility was visually determined, and was ranked according to the following evaluation standards, O: A polymer is completely dissolved without precipitation, and a clear solution is formed; and X: When mixed with IBXA, a solution becomes cloudy or a polymer precipitates. The results are depicted in Tables 1 and 2.

TABLE 1

| | Mass ratio | | |
|---|---|---|---|
| | 40% by weight adhesive additive composition | IBXA | Compatibility |
| Example 1-1 | 3 | 7 | O |
| Example 1-2 | 5 | 5 | O |
| Example 1-3 | 8 | 2 | O |

TABLE 2

| | Mass ratio | | |
|---|---|---|---|
| | 40% by weight adhesive additive composition | IBXA | Compatibility |
| Comparative Example 1-1 | 3 | 7 | X |
| Comparative Example 1-2 | 5 | 5 | X |
| Comparative Example 1-3 | 8 | 2 | O |

As depicted in Tables 1 and 2, it has been confirmed that owing to the reduction in molecular weight, the polymer has improved solubility in NVF and also has higher compatibility with the acrylate. In Comparative Example 1-3, it is presume that the adhesive additive composition was compatible with the acrylate for the abundance of NVF.

[3] Formulation of Adhesive Additive Compositions and Preparation of their Cured Films Example 2-1

Under air, 3.0000 g of the triazine-based, hyperbranched polymer HB-TmDAL-T obtained in Synthesis Example 1 was added to a 10 mL sample bottle. 7.0000 g of NVF was added as a reactive diluent to the triazine-based, hyperbranched polymer HB-TmDAL-T. Using a mixing rotor at 110 rpm, the contents were stirred at room temperature until the polymer was completely dissolved and the resulting solution became uniform. After the stirring, a varnish with the triazine-based, hyperbranched polymer contained at 30% by weight was obtained as a clear, pale yellow solution in which the polymer was completely dissolved.

Next, to 10.0000 g of the 30% by weight varnish, 0.010 g (0.1 part by weight per 100 parts by weight of the 30% by weight varnish) of BYK-333 (product of BYK-Chemie Japan K.K.) was added as a leveling agent. Finally, 0.500 g (5.00 parts by weight per 100 parts by weight of the 30% by weight varnish) of Irugacure 2959 (product of BASF SE) was added as a photoradical polymerization initiator. The contents were stirred until the solutes were completely dissolved and the resulting solution became uniform, whereby an adhesive additive composition with the triazine-based, hyperbranched polymer contained at 29% by weight (hereinafter simply referred to as "HB-TmDAL-TN30") was obtained. Using a spin coater, HB-TmDAL-TN30 so obtained was spin-coated on a quartz substrate under the conditions of 7,000 rpm aid 30 seconds, followed by UV curing to a cumulative light quantity of 1,000 mJ/cm$^2$ under a nitrogen atmosphere so that a thin film of the hyperbranched polymer was obtained (thickness: 3.0 μm).

Example 2-2

Under air, 4.0000 g of the triazine-based, hyperbranched polymer HB-TmDAL-T obtained in Synthesis Example 1 was added to a 10 mL sample bottle. 6.0000 g of NVF was added as a reactive diluent to the triazine-based, hyperbranched polymer HB-TmDAL-T. Using a mixing rotor at 110 rpm, the contents were stirred at room temperature until the polymer was completely dissolved and the resulting solution became uniform. After the stirring, a varnish with the triazine-based, hyperbranched polymer contained at 40% by weight was obtained as a clear, pale yellow solution in which the polymer was completely dissolved.

Next, to 10.0000 g of the 40% by weight varnish, 0.010 g (0.1 part by weight per 100 parts by weight of the 40% by weight varnish) of BYK-333 (product of BYK-Chemie Japan K.K.) was added as a leveling agent. Finally, 0.500 g (5.00 parts by weight per 100 parts by weight of the 40% by weight varnish) of Irugacure 2959 (product of BASF SE) was added as a photoradical polymerization initiator. The contents were stirred until the solutes were completely dissolved and the resulting solution became uniform, whereby an adhesive additive composition with the triazine-based, hyperbranched polymer contained at 39% by weight (hereinafter simply referred to as "HB-TmDAL-TN40") was obtained.

A thin film of the hyperbranched polymer was obtained (thickness: 4.3 μm) in a similar manner as in Example 2-1 except for the use of HB-TmDAL-TN40 obtained above.

Examples 2-3 and 2-4

In a similar manner as in Examples 2-1 and 2-2 except that the triazine-based, hyperbranched polymer HB-TmDAL-T2 obtained in Synthesis Example 2 was used instead of the triazine-based, hyperbranched polymer HB-TmDAL-T, an adhesive additive composition with the triazine-based, hyperbranched polymer contained at 29% by weight (hereinafter simply referred to as "HB-TmDAL-T2N30") and an adhesive additive composition with the triazine-based, hyperbranched polymer contained at 39% by weight (hereinafter simply referred to as "HB-TmDAL-T2N40") were individually obtained.

Examples 2-5 and 2-6

In a similar manner as in Examples 2-1 and 2-2 except that the triazine-based, hyperbranched polymer HB-TmDAL-T3 obtained in Synthesis Example 3 was used instead of the triazine-based, hyperbranched polymer HB-TmDAL-T, an adhesive additive composition with the triazine-based, hyperbranched polymer contained at 29% by weight (hereinafter simply referred to as "HB-TmDAL-T3N30") and an adhesive additive composition with the triazine-based, hyperbranched polymer contained at 39% by weight (hereinafter simply referred to as "HB-TmDAL-T3N40") were individually obtained.

Example 2-7

Under air, 5.0000 g of the triazine-based, hyperbranched polymer HB-TmDAL-T obtained in Synthesis Example 1 was added to a 10 mL sample bottle. 4.0000 g of NVF and 1.0000 g of 4-acryloylmorpholine (hereinafter abbreviated as "ACMO") were added as reactive diluents to the triazine-based, hyperbranched polymer HB-TmDAL-T. Using a mixing rotor at 110 rpm, the contents were stirred at room temperature until the polymer was completely dissolved and the resulting solution became uniform. After the stirring, a varnish with the triazine-based, hyperbranched polymer contained at 50% by weight was obtained as a clear, pale yellow solution in which the polymer was completely dissolved.

Next, to 5.0000 g of the 50% by weight varnish, 0.005 g (0.1 part by weight per 100 parts by weight of the 50% by weight varnish) of BYK-333 (product of BYK-Chemie Japan K.K.) was added as a leveling agent, and 0.2500 g (5.00 parts by weight per 100 parts by weight of the 50% by weight varnish) of Irugacure 2959 (product of BASF SE) was added as a photoradical polymerization initiator. The contents were stirred until the solutes were completely dissolved and the resulting solution became uniform, whereby an adhesive additive composition with the triazine-based, hyperbranched polymer contained at 49% by weight (hereinafter simply referred to as "HB-TmDAL-TNA50") was obtained. Using a spin coater, HB-TmDAL-TNA50 so obtained was spin-coated on a quartz substrate under the conditions of 2,000 rpm and 30 seconds, followed by UV curing to a cumulative light quantity of 1,000 mJ/cm$^2$ under a nitrogen atmosphere so that a thin film of the hyperbranched polymer was obtained.

[Refractive Indices of Adhesive Additive Compositions]

With respect to the individual adhesive additive compositions formulated above in Examples 2-1 to 2-6, their refractive indices in solutions were measured (measurement temperature: 20° C.). The results are depicted in Table 3.

TABLE 3

| | Adhesive additive composition | Liquid refractive index (@589 nm) |
|---|---|---|
| Example 2-1 | HB-TmDAL-TN30 | 1.5624 |
| Example 2-2 | HB-TmDAL-TN40 | 1.5879 |
| Example 2-3 | HB-TmDAL-T2N30 | 1.5688 |
| Example 2-4 | HB-TmDAL-T2N40 | 1.5938 |
| Example 2-5 | HB-TmDAL-T3N30 | 1.5681 |
| Example 2-6 | HB-TmDAL-T3N40 | 1.5945 |

[Measurements of Refractive Index, Total Light Transmittance and Haze Data of Films]

The refractive indices of the cured films prepared above in Examples 2-1, 2-2 and 2-7 were measured. Further, the cured films prepared above in Examples 2-1 and 2-2 were measured for total light transmittance and haze value. The results are depicted together in Table 4. Further, the transmittance spectrum of the cured film prepared in Example 2-2 was measured. The results are depicted in FIG. 1.

TABLE 4

| | Adhesive additive composition | Total light transmittance (%) | Haze value (%) | Refractive index of cured film (@550 nm) |
|---|---|---|---|---|
| Example 2-1 | HB-TmDAL-TN30 | 98.75 | 0.08 | 1.6280 |
| Example 2-2 | HB-TmDAL-TN40 | 99.15 | 0.30 | 1.6479 |
| Example 2-7 | HB-TmDAL-TNA50 | — | — | 1.6428 |

As depicted in Table 4, it has been found that concerning HB-TmDAL-TN40 and HB-TmDAL-TNA50, their cured films have refractive indices of 1.64 to 1.65 and hence have high refractive indices as cured materials of solvent-free compositions. Further, as depicted in FIG. 1, HB-TmDAL-TN40 (thickness: 4.3 μm) has been found to have a transmittance at least 95% and at least 400 nm and hence to have very high transparency.

[4] Formulation of Solvent-Free, Light-Curable Adhesives and Preparation of their Cured Films

Example 3-1

Under air, 5.0000 g of the triazine-based, hyperbranched polymer HB-TmDAL-T obtained in Synthesis Example 1 was added to a 10 mL sample bottle. 5.0000 g of NVF was added as a reactive diluent to the triazine-based, hyperbranched polymer HB-TmDAL-T. Using a mixing rotor at 110 rpm, the contents were stirred at room temperature until the polymer was completely dissolved and the resulting solution became uniform. After the stirring, an adhesive additive composition with the triazine-based, hyperbranched polymer contained at 50% by weight (hereinafter simply referred to as "HB-TmDAL-TN50") was obtained as a clear, pale yellow solution in which the polymer was completely dissolved.

Next, to 0.6000 g of the 50% by weight adhesive additive composition, 1.4000 g of IBXA was added (mass ratio: 3:7). Further, 0.002 g (0.1 part by weight per 100 parts by weight of the 50% by weight adhesive additive composition and IBXA) of BYK-333 (product of BYK-Chemie Japan K.K.) was added as a leveling agent. Finally, 0.010 g (5.00 parts by weight per 100 parts by weight of the 50% by weight adhesive additive composition and IBXA) of Irugacure 2959 (product of BASF SE) was added as a photoradical polymerization initiator. The contents were stirred until the solutes were completely dissolved and the resulting solution became uniform, whereby an adhesive was obtained.

Using a spin coater, the adhesive so obtained was spin-coated on a quartz substrate under the conditions of 2,000 rpm and 30 seconds, followed by UV curing to a cumulative light quantity of 1,000 mJ/cm$^2$ under a nitrogen atmosphere so that a cured film was obtained.

Examples 3-2 and 3-3, Comparative Example 3-1

Individual adhesives were obtained in a similar manner as in Example 3-1 except that the mass ratio of the 50% by weight adhesive additive composition to IBXA was individually changed to 5:5, 8:2 and 0:10.

Cured films were obtained in a similar manner as in Example 3-1 except for the use of the individual adhesives obtained above.

Example 3-4

Under air, 5.0000 g of the triazine-based, hyperbranched polymer HB-TmDAL-T obtained in Synthesis Example 1 was added to a 10 mL sample bottle. 5.0000 g of NVF was added as a reactive diluent to the triazine-based, hyperbranched polymer HB-TmDAL-T. Using a mixing rotor at 110 rpm, the contents were stirred at room temperature until the polymer was completely dissolved and the resulting solution became uniform. After the stirring, an adhesive additive composition with the triazine-based, hyperbranched polymer contained at 50% by weight was obtained as a clear, pale yellow solution in which the polymer was completely dissolved.

Next, to 0.6000 g of the 50% by weight adhesive additive composition, 1.4000 g of urethane acrylate (8UX-015A, product of Taisei Fine Chemical Co., Ltd.) was added (mass ratio: 3:7). Further, 0.002 g (0.1 part by weight per 100 parts by weight of the 50% by weight adhesive additive composition and IBXA) of BYK-333 (product of BYK-Chemie Japan K.K.) was added as a leveling agent. Finally, 0.010 g (5.00 parts by weight per 100 parts by weight of the 50% by weight adhesive additive composition and IBXA) of Irugacure 2959 (product of BASF SE) was added as a photoradical polymerization initiator. The contents were stirred until the solutes were completely dissolved and the resulting solution became uniform, whereby an adhesive was obtained.

A cured film was obtained in a similar manner as in Example 3-1 except for the use of the adhesive obtained above.

Examples 3-5 and 3-6, Comparative Example 3-2

Individual adhesives were obtained in a similar manner as in Example 3-3 except that the mass ratio of the 50% by weight adhesive additive composition to urethane acrylate was individually changed to 5:5, 8:7 and 0:10.

Cured films were obtained in a similar manner as in Example 3-1 except for the use of the individual adhesives obtained above.

[Refractive Indices of Adhesive Additive Compositions]

With respect to the individual adhesives formulated above in Examples 3-1 to 3-6 and Comparative Examples 3-1 and 3-2, their refractive indices in solutions were measured (measurement temperature: 20° C.). The results are depicted in Table 5.

[Refractive Indices of Cured Films]

The cured films obtained above in Examples 3-1 to 3-6 and Comparative Examples 3-1 and 3-2 were measured for refractive index. The results are also depicted together in Table 5.

by increasingly adding HB-TmDAL-TN50, refractive index can be made higher to such a level as exceeding 1.6.

Example 3-7

Under air, 5.0000 g of the triazine-based, hyperbranched polymer HB-TmDAL-T obtained in Synthesis Example 1 was added to a 10 mL sample bottle. 5.0000 g of N-dimethylacrylamide (hereinafter abbreviated as "DMAA") was added as a reactive diluent to the triazine-based, hyperbranched polymer HB-TmDAL-T. Using a mixing rotor at 110 rpm, the contents were stirred at 50° C. until the polymer was completely dissolved and the resulting solution became uniform. After the stirring, an adhesive additive composition with the triazine-based, hyperbranched polymer contained at 50% by weight (hereinafter simply referred to as "HB-TmDAL-TD50") was obtained as a clear, pale yellow solution in which the polymer was completely dissolved.

Next, to 4.0000 g of the 50% by weight adhesive additive composition, 1.0000 g of triallyl cyanurate (TAC, product of Evonik Degussa GmbH) was added (mass ratio: 4:1). Further, 0.25 g (5.00 parts by weight per 100 parts by weight of the 50% by weight adhesive additive composition and TAC) of Irugacure 2959 (product of BASF SE) was added as a photoradical polymerization initiator. The contents were stirred until the solutes were completely dissolved and the resulting solution became uniform, whereby an adhesive (hereinafter simply referred to as "TD50-TAC") was obtained.

Example 3-8

To 4.0000 g of the 50% by weight adhesive additive composition (HB-TmDAL-TD50) formulated in Example 3-7, 1.0000 g of NK Ester A-DCP (product of Shin-Nakamura Chemical Co., Ltd.) was added (mass ratio 4:1). Further, 0.25 g (5.00 parts by weight per 100 parts by weight of the 50% by weight adhesive additive composition and A-DCP) of Irugacure 2959 (product of BASF SE) was added as a photoradical polymerization initiator. The contents were stirred until the solutes were completely dissolved and the resulting solution became uniform, whereby an adhesive (hereinafter simply referred to as "TD50-DCP") was obtained.

Example 3-9

To 4.0000 g of the 50% by weight adhesive additive composition (HB-TmDAL-TD50) formulated in Example

TABLE 5

| | Mass ratio | | Thickness | Liquid refractive index | Refractive index of cured film |
|---|---|---|---|---|---|
| | HB-TmDAL-TN50 | IBXA | 8UX-015A | (μm) | (@589 nm) | (@550 nm) |
| Comparative Example 3-1 | 0 | 10 | — | 4 | 1.4748 | 1.5093 |
| Example 3-1 | 3 | 7 | — | 10 | 1.5142 | 1.5448 |
| Example 3-2 | 5 | 5 | — | 17 | 1.5416 | 1.5722 |
| Example 3-3 | 8 | 2 | — | 36 | 1.5850 | 1.6096 |
| Comparative Example 3-2 | 0 | — | 10 | 45 | 1.4902 | 1.5275 |
| Example 3-4 | 3 | — | 7 | 45 | 1.5298 | 1.5617 |
| Example 3-5 | 5 | — | 5 | 45 | 1.5562 | 1.5872 |
| Example 3-6 | 8 | — | 2 | 45 | 1.5923 | 1.6199 |

As depicted in Table 5, it has been found that refractive index is approximately 1.5 with general acrylate resins but 3-7, 1.0000 g of NK Ester A-LEN-10 (product of Shin-Nakamura Chemical Co., Ltd.) was added (mass ratio 4:1).

Further, 0.75 g (5.00 parts by weight per 100 parts by weight of the 50% by weight adhesive additive composition and A-LEN-10) of Irugacure 2959 (product of BASF SE) was added as a photoradical polymerization initiator. The contents were stirred until the solutes were completely dissolved and the resulting solution became uniform, whereby an adhesive (hereinafter simply referred to as "TD50-LEN") was obtained.

Example 3-10

To 4.0000 g of the 50% by weight adhesive additive composition (HB-TmDAL-TD50) formulated in Example 3-7, 1.0000 g of IBXA was added (mass ratio 4:1). Further, 0.25 g (5.00 parts by weight per 100 parts by weight of the 50% by weight adhesive additive composition and IBXA) of Irugacure 2959 (product of BASF SE) was added as a photoradical polymerization initiator. The contents were stirred until the solutes were completely dissolved and the resulting solution became uniform, whereby an adhesive (hereinafter simply referred to as "TD50-IB") was obtained.

Example 3-11

To 4.0000 g of the 50% by weight adhesive additive composition (HB-TmDAL-TD50) formulated in Example 3-7, 1.0000 g of adamantly acrylate (M-104, product of Idemitsu Kosan Co., Ltd.) was added (mass ratio 4:1). Further, 0.25 g (5.00 parts by weight per 100 parts by weight of the 50% by weight adhesive additive composition and M-104) of Irugacure 2959 (product of BASF SE) was added as a photoradical polymerization initiator. The contents were stirred until the solutes were completely dissolved and the resulting solution became uniform, whereby an adhesive (hereinafter simply referred to as "TD50-104") was obtained.

[Refractive Indices of Cured Films]

0.5000 g portions of the individual adhesives formulated above in Examples 3-7 to 3-11 were separately placed on quartz substrates which had been subjected to release treatment with Novec 1720 (product of 3M Company), and were then held between the quarts substrates and similar quartz substrates. Silicon spacers of 100 μm thickness were used so that the resulting cured films would have an equal thickness. Subsequently, UV curing was conducted to a cumulative light quantity of 1,000 mJ/cm² under a nitrogen atmosphere. After post baking was carried out at 120° C. for ten minutes, the release-treated quartz substrates were separated to obtain cured films.

The refractive indices of the individual cured films prepared above were measured by a prism coupler. The results are depicted in Table 6.

TABLE 6

| Adhesive | | Refractive index of cured film (@550 nm) |
|---|---|---|
| Example 3-7 | TD50-TAC | 1.6154 |
| Example 3-8 | TD50-DCP | 1.6112 |
| Example 3-9 | TD50-LEN | 1.6247 |
| Example 3-10 | TD50-IB | 1.6039 |
| Example 3-11 | TD50-104 | 1.6099 |

As depicted in Table 6, it is understood that all the cured films show high refractive indices over 1.6.

[Water Absorption Rates of Cured Films]

1.0000 g portions of the individual adhesives formulated above in Examples 3-7 to 3-11 were separately placed on quartz substrates which had been subjected to release treatment with Novec 1720 (product of 3M Company), and were then held between the quarts substrates and similar quartz substrates. Silicon spacers of 1 mm thickness were used so that the resulting cured films would have an equal thickness. Subsequently, UV curing was conducted to a cumulative light quantity of 1,000 mJ/cm² under a nitrogen atmosphere. After post baking was carried out at 120° C. for ten minutes, the release-treated quartz substrates were separated to obtain cured films.

The individual cured films prepared above were immersed for 24 hours in water under room temperature, and their water absorption rates were calculated from the differences in weight before and after the immersion. The results are depicted in Table 7.

TABLE 7

| | Adhesive | Water Absorption Rate (%) |
|---|---|---|
| Example 3-7 | TD50-TAC | 46.1 |
| Example 3-8 | TD50-DCP | 2.7 |
| Example 3-9 | TD50-LEN | 5.9 |
| Example 3-10 | TD50-IB | 3.0 |
| Example 3-11 | TD50-104 | 2.7 |

As depicted in Table 7, TD50-TAC alone had the very high water absorption rate of 46%, but the remaining adhesives had values as low as from 2.5% to less than 6%.

[Evaluation of Adhesiveness]

Using the adhesive TD50-TAC formulated above in Example 3-7, its tensile shear adhesion strength to a glass substrate was evaluated following JIS K 6850.

The glass substrate used had a thickness of 3 mm, the adhesive was formed into a cured film by a method similar to that used at the time of the measurement of the indices, and its thickness was set at 100 μm. The moving speed of a crosshead was set at 5 mm/minute, and the value obtained by dividing the maximum load (N) with an area of adhesion (mm²) upon rupture of the specimen was recorded as tensile shear adhesion strength.

The glass/glass tensile shear adhesion strength of the adhesive TD50-TAC was 1.6 MPa.

The invention claimed is:

1. A solvent-free light-curable adhesive additive composition consisting of:
   a triazine ring-containing polymer having a weight average molecular weight of 500 to 7,000 and a recurring unit structure of formula (1) below, a reactive diluent of formula (A) below, and optionally one or more other additives selected from the group consisting of a photoradical polymerization initiator, a leveling agent, a surfactant and a silane coupling agent, in which the solvent-free light-curable adhesive additive composition is free of any solvent:

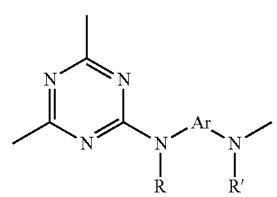

(1)

in the formula, R and R' each independently represent a hydrogen atom, an alkyl group, an alkoxy group, an aryl group, or an aralkyl group, and Ar represents at least one moiety selected from the group consisting of moieties of formulas (2) to (13):

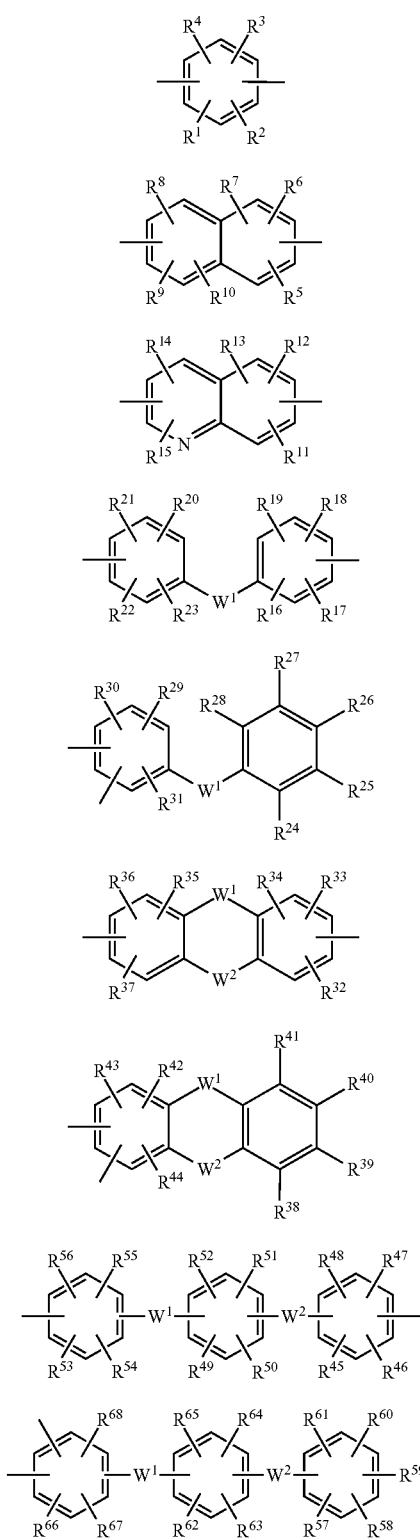

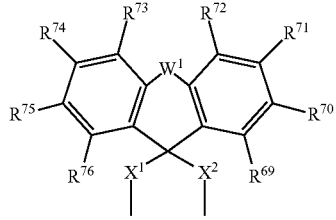

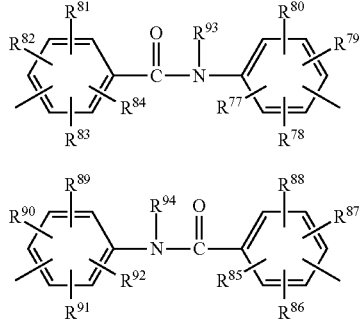

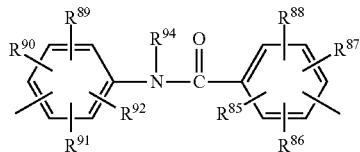

in the formulas, $R^1$ to $R^{92}$ each independently represent a hydrogen atom, a halogen atom, a carboxyl group, a sulfo group, a linear or branched alkyl group having 1 to 10 carbons, or a linear or branched alkoxy group having 1 to 10 carbons, $R^{93}$ and $R^{94}$ each independently represent a hydrogen atom, or a linear or branched alkyl group having 1 to 10 carbons, $W^1$ and $W^2$ each independently represent a single bond, $CR^{95}R^{96}$ (in which $R^{95}$ and $R^{96}$ each independently represent a hydrogen atom or a linear or branched alkyl group having 1 to 10 carbons, with the proviso that $R^{95}$ and $R^{96}$ may be fused together to form a ring), C=O, O, S, SO, $SO_2$, or $NR^{97}$ (in which $R^{97}$ represents a hydrogen atom or a linear or branched alkyl group having 1 to 10 carbons), and $X^1$ and $X^2$ each independently represent a single bond, a linear or branched alkylene group having 1 to 10 carbons, or a group of formula (14):

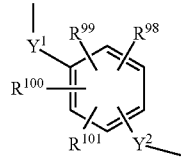

in the formula, $R^{98}$ to $R^{101}$ each independently represent a hydrogen atom, a halogen atom, a carboxyl group, a sulfo group, a linear or branched alkyl group having 1 to 10 carbons, or a linear or branched alkoxy group having 1 to 10 carbons, and $Y^1$ and $Y^2$ each independently represent a single bond, or a linear or branched alkylene group having 1 to 10 carbons,

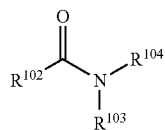
(A)

in the formula, $R^{102}$ and $R^{104}$ each independently represent a hydrogen atom, an alkyl group having 1 to 10 carbons or a polymerizable carbon-carbon double bond-containing group, and $R^{103}$ represents a hydrogen atom or an alkyl group having 1 to 10 carbons, with the proviso that one of $R^{102}$ and $R^{104}$ is a polymerizable carbon-carbon double bond-containing group but $R^{102}$ and $R^{104}$ are not both a polymerizable carbon-carbon double bond-containing group at the same time.

2. The solvent-free light-curable adhesive additive composition of claim 1, wherein $R^{102}$ and $R^{103}$ in the formula (A) are each a hydrogen atom and $R^{104}$ is a polymerizable carbon-carbon double bond-containing group.

3. The solvent-free light-curable adhesive additive composition of claim 1 or 2, wherein the reactive diluent includes one or more reactive diluent selected from the group consisting of N-vinylformamide, 4-acryloylmorpholine, N-dimethylacrylamide, and N-diethylacrylamide.

4. The solvent-free light-curable adhesive additive composition of claim 1, wherein Ar is represented by the following formula (15):

[Chemical Formula 5]

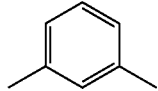
(15)

5. The solvent-free light-curable adhesive additive composition of claim 1, which is for a solvent-free light-curable adhesive comprising an acrylic material as an adhesive ingredient.

6. A solvent-free light-curable adhesive consisting of:
a solvent-free light-curable adhesive additive composition consisting of:
a triazine ring-containing polymer having a weight average molecular weight of 500 to 7,000 and a recurring unit structure of formula (1) below, a reactive diluent of formula (A) below, and optionally one or more other additives selected from the group consisting of a photoradical polymerization initiator, a leveling agent, a surfactant and a silane coupling agent, in which the solvent-free light-curable adhesive additive composition is free of any solvent:

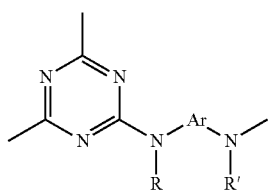
(1)

in the formula, R and R' each independently represent a hydrogen atom, an alkyl group, an alkoxy group, an aryl group, or an aralkyl group, and Ar represents at least one moiety selected from the group consisting of moieties of formulas (2) to (13):

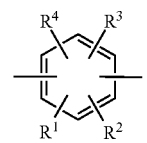
(2)

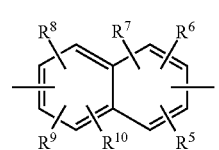
(3)

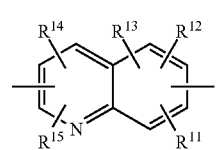
(4)

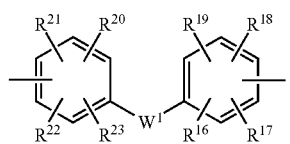
(5)

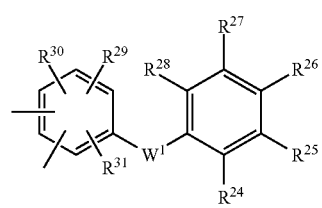
(6)

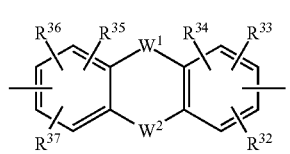
(7)

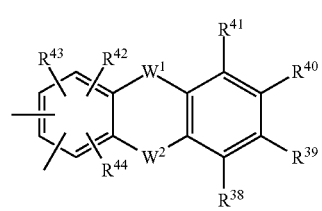
(8)

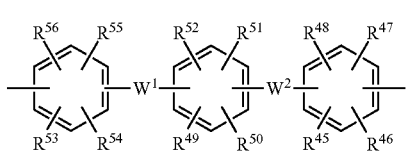
(9)

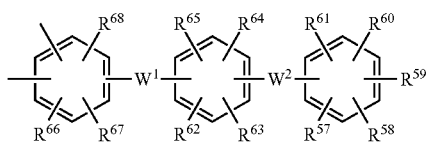
(10)

-continued

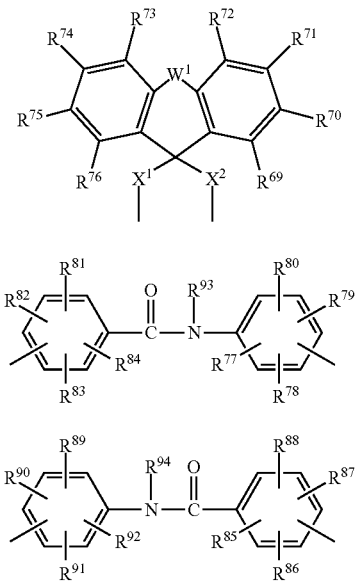

(11)

(12)

(13)

in the formulas, $R^1$ to $R^{92}$ each independently represent a hydrogen atom, a halogen atom, a carboxyl group, a sulfo group, a linear or branched alkyl group having 1 to 10 carbons, or a linear or branched alkoxy group having 1 to 10 carbons, $R^{93}$ and $R^{94}$ each independently represent a hydrogen atom, or a linear or branched alkyl group having 1 to 10 carbons, $W^1$ and $W^2$ each independently represent a single bond, $CR^{95}R^{96}$ (in which $R^{95}$ and $R^{96}$ each independently represent a hydrogen atom or a linear or branched alkyl group having 1 to 10 carbons, with the proviso that $R^{95}$ and $R^{96}$ may be fused together to form a ring), C=O, O, S, SO, $SO_2$, or $NR^{97}$ (in which $R^{97}$ represents a hydrogen atom or a linear or branched alkyl group having 1 to 10 carbons), and $X^1$ and $X^2$ each independently represent a single bond, a linear or branched alkylene group having 1 to 10 carbons, or a group of formula (14):

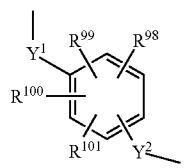

(14)

in the formula, $R^{98}$ to $R^{101}$ each independently represent a hydrogen atom, a halogen atom, a carboxyl group, a sulfo group, a linear or branched alkyl group having 1 to 10 carbons, or a linear or branched alkoxy group having 1 to 10 carbons, and $Y^1$ and $Y^2$ each independently represent a single bond, or a linear or branched alkylene group having 1 to 10 carbons,

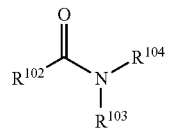

(A)

in the formula, $R^{102}$ and $R^{104}$ each independently represent a hydrogen atom, an alkyl group having 1 to 10 carbons or a polymerizable carbon-carbon double bond-containing group, and $R^{103}$ represents a hydrogen atom or an alkyl group having 1 to 10 carbons, with the proviso that one of $R^{102}$ and $R^{104}$ is a polymerizable carbon-carbon double bond-containing group but $R^{102}$ and $R^{104}$ are not both a polymerizable carbon-carbon double bond-containing group at the same time; and (meth)acrylic monomers, wherein the (meth)acrylic monomers are one or more methyl (meth)acrylate, ethyl (meth)acrylate, butyl (meth)acrylate, 2-(2-ethoxyethoxy)ethyl acrylate, tetrahydrofurfuryl (meth)acrylate, lauryl acrylate, isooctyl acrylate, isodecyl acrylate, 2-phenoxyethyl acrylate, 2-ethylhexyl (meth)acrylate, isobornyl (meth)acrylate, adamantly (meth)acrylate, dicyclopentenyloxyethyl (meth)acrylate, dicyclopentadienyl (meth)acrylate, 2-hydroxyethyl (meth)acrylate, 2-hydroxypropyl (meth)acrylate, 2-hydroxybutyl (meth)acrylate, caprolactone acrylate, morpholine (meth)acrylate, hexanediol di(meth)acrylate, ethylene glycol dimethacrylate, trimethylolpropane triacrylate, and urethane acrylate.

7. The solvent-free light-curable adhesive of claim 6, further comprising:
a photoradical polymerization initiator.

8. The solvent-free light-curable adhesive of claim 6, further comprising:
said photoradical polymerization initiator.

9. An electronic device fabricated using the adhesive film of claim 8.

10. An optical device fabricated using the adhesive film of claim 8.

11. A solvent-free light-curable adhesive additive composition consisting of
a triazine ring-containing polymer having a weight average molecular weight of 500 to 7,000 and a recurring unit structure of formula (1) below, and a reactive diluent of formula (A) below, in which the solvent-free light-curable adhesive additive composition is free of any solvent:

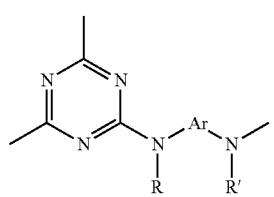

(1)

in the formula, R and R' each independently represent a hydrogen atom, an alkyl group, an alkoxy group, an aryl group, or an aralkyl group, and Ar represents at least one moiety selected from the group consisting of moieties of formulas (2) to (13):

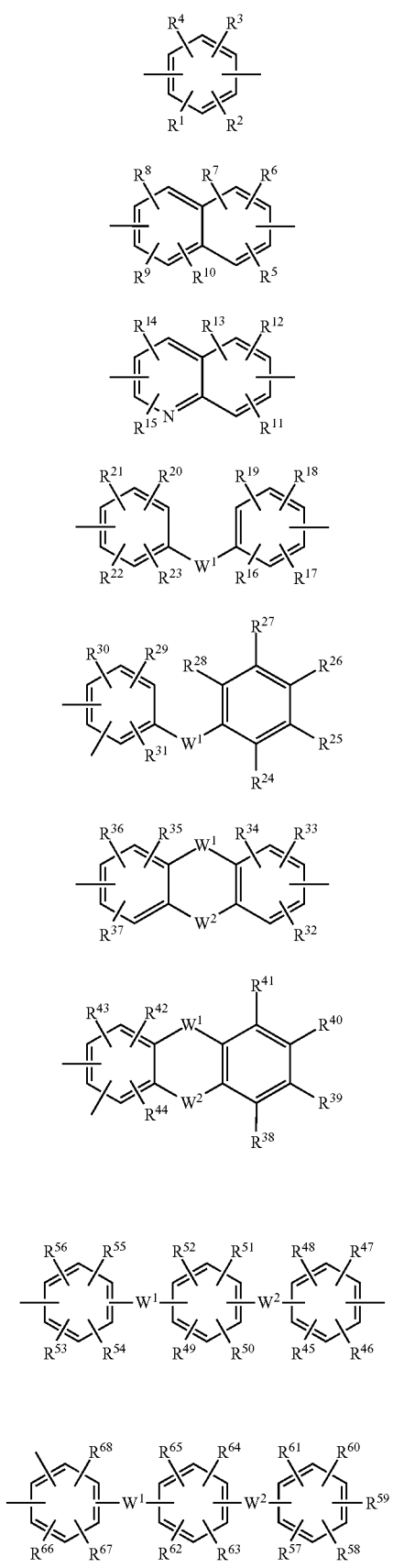

in the formulas, $R^1$ to $R^{92}$ each independently represent a hydrogen atom, a halogen atom, a carboxyl group, a sulfo group, a linear or branched alkyl group having 1 to 10 carbons, or a linear or branched alkoxy group having 1 to 10 carbons, $R^{93}$ and $R^{94}$ each independently represent a hydrogen atom, or a linear or branched alkyl group having 1 to 10 carbons, $W^1$ and $W^2$ each independently represent a single bond, $CR^{95}R^{96}$ (in which $R^{95}$ and $R^{96}$ each independently represent a hydrogen atom or a linear or branched alkyl group having 1 to 10 carbons, with the proviso that $R^{95}$ and $R^{96}$ may be fused together to form a ring), C=O, O, S, SO, $SO_2$, or $NR^{97}$ (in which $R^{97}$ represents a hydrogen atom or a linear or branched alkyl group having 1 to 10 carbons), and $X^1$ and $X^2$ each independently represent a single bond, a linear or branched alkylene group having 1 to 10 carbons, or a group of formula (14):

in the formula, $R^{98}$ to $R^{101}$ each independently represent a hydrogen atom, a halogen atom, a carboxyl group, a sulfo group, a linear or branched alkyl group having 1 to 10 carbons, or a linear or branched alkoxy group having 1 to 10 carbons, and $Y^1$ and $Y^2$ each independently represent a single bond, or a linear or branched alkylene group having 1 to 10 carbons,

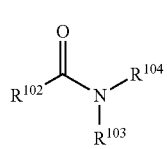

(A)

in the formula, $R^{102}$ and $R^{104}$ each independently represent a hydrogen atom, an alkyl group having 1 to 10 carbons or a polymerizable carbon-carbon double bond-containing group, and $R^{103}$ represents a hydrogen atom or an alkyl group having 1 to 10 carbons, with the proviso that one of $R^{102}$ and $R^{104}$ is a polymerizable carbon-carbon double bond-containing group but $R^{102}$ and $R^{104}$ are not both a polymerizable carbon-carbon double bond-containing group at the same time.

* * * * *